United States Patent
Bao et al.

(10) Patent No.: US 10,890,945 B2
(45) Date of Patent: *Jan. 12, 2021

(54) ELECTRONIC DEVICE WITH DISPLAY PANEL

(71) Applicant: GUANGDONG OPPO MOBILE TELECOMMUNICATIONS CORP., LTD., Guangdong (CN)

(72) Inventors: Xiaoming Bao, Guangdong (CN); Maozhao Huang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/793,854

(22) Filed: Feb. 18, 2020

(65) Prior Publication Data

US 2020/0183456 A1    Jun. 11, 2020

Related U.S. Application Data

(63) Continuation of application No. 15/839,885, filed on Dec. 13, 2017, now Pat. No. 10,627,864.

(30) Foreign Application Priority Data

Jan. 9, 2017    (CN) .......................... 2017 1 0013757

(51) Int. Cl.
*G06F 1/16*    (2006.01)
*G02F 1/1335*    (2006.01)
(Continued)

(52) U.S. Cl.
CPC ........ *G06F 1/1637* (2013.01); *G02F 1/13338* (2013.01); *G02F 1/133514* (2013.01);
(Continued)

(58) Field of Classification Search
CPC ........... G02F 1/13338; G02F 1/133514; G02F 1/134309; G06F 1/1637; G06F 1/1626;
(Continued)

(56) References Cited

U.S. PATENT DOCUMENTS 8,890,771 B2    11/2014    Pance
8,923,693 B2    12/2014    Yeates
(Continued)

FOREIGN PATENT DOCUMENTS

CN    201955706    8/2011
CN    102662302    9/2012
(Continued)

OTHER PUBLICATIONS

SIPO, First Office Action for CN Application No. 201710013757.8, dated Aug. 2, 2018.
(Continued)

*Primary Examiner* — Nathanael R Briggs
(74) *Attorney, Agent, or Firm* — Hodgson Russ LLP

(57) ABSTRACT

An electronic device includes a display panel, two camera and at least one light sensor. The display panel includes a full screen display area. The full screen display area includes a display surface and a back surface opposite to the display surface. The display panel defines a slot extending through the display surface and the back surface, and the slot is located in the full screen display area. The full screen display area includes a plurality of image pixels configured to display data information. The two cameras are received in the slot, and the at least one light sensor is received in the slot.

20 Claims, 64 Drawing Sheets

(51) Int. Cl.

| | | |
|---|---|---|
| *G02F 1/1333* | (2006.01) | |
| *G02F 1/1343* | (2006.01) | |
| *G06F 3/041* | (2006.01) | |
| *G09G 3/3208* | (2016.01) | |
| *G09G 3/36* | (2006.01) | |
| *H04N 5/225* | (2006.01) | |
| *H04M 1/02* | (2006.01) | |
| *H01L 27/32* | (2006.01) | |

(52) U.S. Cl.
CPC ...... *G02F 1/134309* (2013.01); *G06F 1/1626* (2013.01); *G06F 1/1684* (2013.01); *G06F 1/1686* (2013.01); *G06F 1/1688* (2013.01); *G06F 3/0412* (2013.01); *G09G 3/3208* (2013.01); *G09G 3/36* (2013.01); *H01L 27/3232* (2013.01); *H04M 1/0264* (2013.01); *H04M 1/0266* (2013.01); *H04N 5/2257* (2013.01); *G06F 1/1643* (2013.01); *H04M 2250/22* (2013.01)

(58) Field of Classification Search
CPC .... G06F 1/1684; G06F 1/1686; G06F 1/1688; G06F 1/1643; G06F 3/0412; G09G 3/3208; G09G 3/36; H01L 27/3232; H04M 1/0264; H04M 1/0266; H04M 2250/22; H04N 5/2257
See application file for complete search history.

(56) References Cited

U.S. PATENT DOCUMENTS

| | | | |
|---|---|---|---|
| 8,947,627 | B2 | 2/2015 | Rappoport et al. |
| 9,143,668 | B2 | 9/2015 | Mathew et al. |
| 9,543,364 | B2 | 1/2017 | Rappoport et al. |
| 10,627,864 | B2 * | 4/2020 | Bao ............... H01L 27/3232 |
| 2005/0226467 | A1 | 10/2005 | Hatano et al. |
| 2008/0246708 | A1 | 10/2008 | Ishiguro |
| 2010/0110283 | A1 | 5/2010 | Shin |
| 2012/0105400 | A1 * | 5/2012 | Mathew ............... H04N 5/2253 345/207 |
| 2013/0094126 | A1 | 4/2013 | Rappoport et al. |
| 2013/0328051 | A1 | 12/2013 | Franklin et al. |
| 2014/0225131 | A1 | 8/2014 | Benson et al. |
| 2014/0346473 | A1 | 11/2014 | Park et al. |
| 2015/0055009 | A1 | 2/2015 | Choi et al. |
| 2016/0147987 | A1 | 5/2016 | Jang et al. |
| 2016/0179139 | A1 | 6/2016 | Ahn et al. |
| 2016/0212311 | A1 | 7/2016 | Mathew et al. |
| 2016/0334661 | A1 | 11/2016 | Tang et al. |
| 2016/0378334 | A1 | 12/2016 | Liu et al. |

FOREIGN PATENT DOCUMENTS

| | | |
|---|---|---|
| CN | 103218077 | 7/2013 |
| CN | 105049556 | 11/2015 |
| CN | 105872137 A | 8/2016 |
| CN | 105991807 | 10/2016 |
| CN | 106293441 | 1/2017 |
| CN | 106657485 | 5/2017 |
| CN | 106708201 | 5/2017 |
| CN | 106843389 | 6/2017 |
| CN | 105872137 B | 10/2017 |
| EP | 2448243 | 5/2012 |
| EP | 3109727 | 12/2016 |
| JP | 2005108540 | 4/2005 |
| JP | 2012098726 | 5/2012 |
| JP | 2016160057 | 9/2016 |
| KR | 20120046040 | 5/2012 |
| RU | 2580474 | 4/2016 |
| RU | 2690748 | 6/2019 |
| WO | 2015009111 | 1/2015 |

OTHER PUBLICATIONS

EPO, Office Action for EP Application No. 17209019.3, dated Aug. 1, 2019.
EPO, Office Action for EP Application No. 17209019.3, dated Aug. 27, 2018.
FIIP, Office Action for RU Application No. 2019123154-08, dated Jan. 21, 2020
USPTO, Office Action for U.S. Appl. No. 15/839,885, dated Apr. 3, 2019.
Alonso-Fernandez et al., "A Comparative Study of Fingerprint Image-Quality Estimation Methods," IEEE Transactions on Information Forensics and Security, vol. 2, No. 4, Dec. 2007, 10 pages.
EPO, Office Action for EP Application No. 17209019.3, dated Feb. 27, 2020.
IPA, Office Action for AU Application No. 2018206587, dated Mar. 20, 2020.
IPOS, Office Action for SG Application No. 11201906194V, dated Apr. 28, 2020.
CIPO, Office Action for CA application 3049186, dated Aug. 7, 2020.
EPO, Office Action for EP application 17209019.3, dated Aug. 12, 2020.
IPO, Office Action for IN application 201714047378, dated Aug. 24, 2020.
JPO, Office Action for JP application 2019-534884, dated Aug. 25, 2020.
KIPO, Office Action for KR application 10-2019-7017423, dated Jul. 9, 2020.

* cited by examiner

ELECTRONIC DEVICE WITH DISPLAY PANEL

CROSS REFERENCE TO RELATED APPLICATIONS

This application is a continuation of U.S. application Ser. No. 15/839,885, filed Dec. 13, 2017, which claims priority to Chinese Application No. 201710013757.8, filed Jan. 9, 2017. The entire disclosures of the above-identified applications are incorporated herein by reference.

FIELD

The present disclosure relates to the field of electronic equipment, and particularly to an electronic device with a display panel.

BACKGROUND

With the development of technologies, electronic device having more functions are becoming more and more popular. Electronic device generally includes a display panel. Electronic devices with display panels have become indispensable devices in people's lives. Typically, the electronic device with the display panel has a relatively small panel ratio, which reduces user experience.

BRIEF DESCRIPTION OF THE DRAWINGS

The aspects and advantages of the embodiments of the present disclosure will become apparent and easily understood from the following description of the embodiments in conjunction with the accompanying drawings.

DETAILED DESCRIPTION OF ILLUSTRATED EMBODIMENTS

Figure 1:
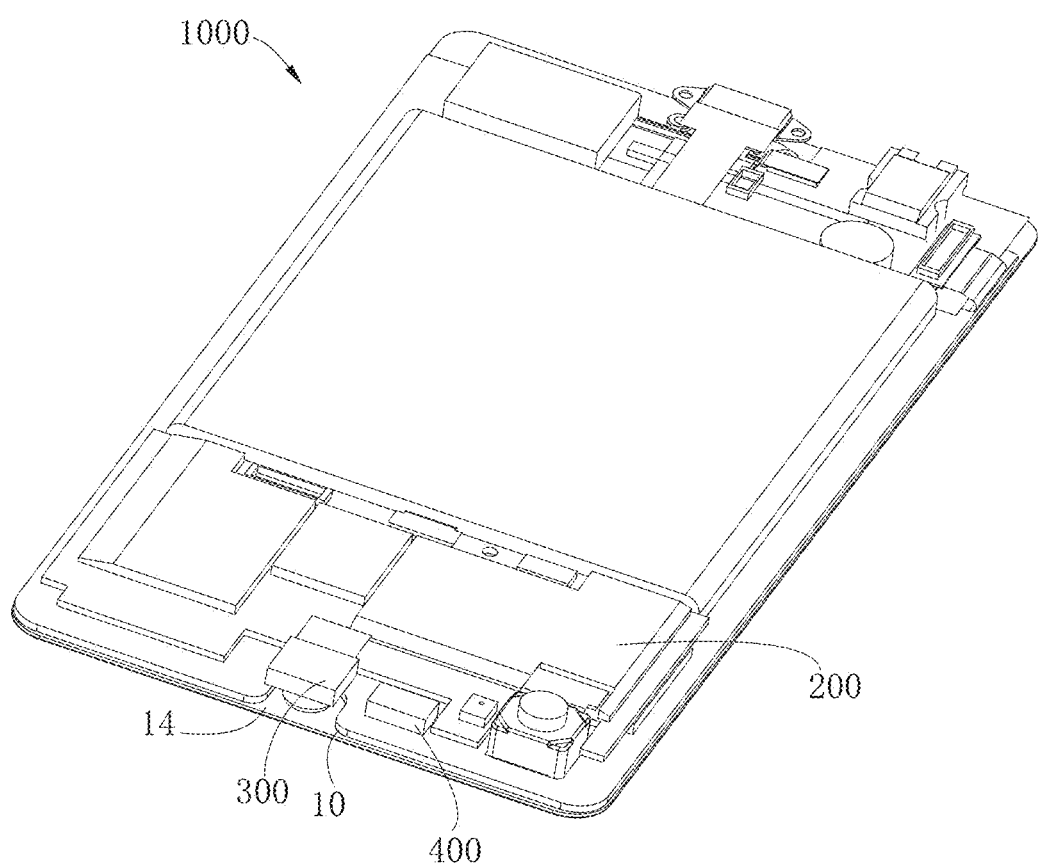
FIG. 1 is a schematic isometric view of an electronic device according to an embodiment of the present disclosure.

The embodiments of the present disclosure are described in detail hereinafter. Examples of the described embodiments are given in the accompanying drawings, wherein the identical or similar reference numerals constantly denote the identical or similar elements or elements having the identical or similar functions. The specific embodiments described with reference to the attached drawings are all exemplary, and are intended to illustrate and interpret the present disclosure, which shall not be construed as causing limitations to the present disclosure.

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an interreaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature, and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature, and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature, and may also include an embodiment in which the first feature is not right "beneath," "below," or "on bottom of" the second feature, or just means that the first feature has a sea level elevation less than the sea level elevation of the second feature.

The disclosure herein provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

The present disclosure is related to an electronic device. The electronic device includes a display panel and a touch panel. The display panel includes a display area including a display surface and a back surface opposite to the display surface. The display panel defines a slot extending through the display surface and the back surface. The slot is located in the display area. The display area includes a plurality of image pixels. The touch panel is coupled to the display panel.

In some embodiments, the display panel is an OLED display panel. The OLED display panel includes a cathode plate, an organic light emitting layer, an anode plate, and a polarizer sequentially stacked. The display surface is a surface of the polarizer remote from the cathode plate. The back surface is a surface of the cathode plate remote from the polarizer.

In some embodiments, the display panel is a liquid crystal display panel. The liquid crystal display panel includes a bottom polarizer, a bottom electrode, a liquid crystal layer, a top electrode, a color filter, and a top polarizer sequentially stacked. The display is a surface of the top polarizer remote from the bottom polarizer. The back surface is a surface of the bottom polarizer remote from the top polarizer.

In some embodiments, the display panel includes a first edge and a main body. The slot includes a notch concaved from the first edge toward the main body of the display panel.

In some embodiments, the notch is concaved from a middle position of the first edge.

In some embodiments, the display panel includes a first edge. The slot includes a first notch and a second notch concaved from the first edge toward the main body of the display panel.

In some embodiments, the display panel includes a first edge. The slot includes a hole located adjacent to the first edge and spaced from the first edge.

In some embodiments, the display panel includes a first edge. The slot includes a hole located adjacent to a middle position of the first edge.

In some embodiments, the display panel includes a first edge. The slot includes a first hole and a second hole located adjacent to the first edge and spaced from the first edge.

In some embodiments, the electronic device further includes at least one camera received in the slot.

In some embodiments, the touch panel defines a second slot corresponding to the slot.

In some embodiments, the electronic device further includes a cover plate. The cover plate defines a third slot corresponding to the slot.

In some embodiments, the at least one camera is at least partially received in at least one of the slot, the second slot, and the third slot, or the at least one camera is located outside at least one of the slot, the second slot, and the third slot.

In some embodiments, the electronic device further includes a cover plate, a body, and a receiver. The cover plate is located on the body and cooperates with the body to form an accommodation space. The body includes a top part, a bottom part, and a side part connecting the top part and the bottom part. The receiver is located in the accommodation space and includes a sound outlet located in the top part or the side part.

In some embodiments, the electronic device further includes a cover plate and a body. The cover plate is located on the body and cooperates with the body to form an accommodation space. The at least one camera and the display panel are located in the accommodation space.

In some embodiments, the electronic device further includes at least one component selected from the group including the at least one camera, a receiver, a light sensor, a projector, a microphone, a speaker, a distance sensor, an illuminator, and a combination thereof.

In some embodiments, the electronic device further includes a receiver and a light sensor. The receiver is located in the accommodation space and includes a sound outlet facing a wall of the display panel surrounding the slot. The light sensor is located on an inner wall of the display panel surrounding the sound outlet. Centers of the at least one camera, the receiver, and the light sensor are on a same line.

In some embodiments, the receiver is located in the accommodation space. The receiver includes a sound outlet facing a wall of the display panel surrounding the slot.

In some embodiments, the light sensor is located on an inner wall of the display panel surrounding the sound outlet. Centers of the at least one camera, the receiver, and the light sensor are on a same line.

In some embodiments, a number of the cameras is two. The two cameras each include a lens holder and a lens barrel coupled to the lens holder. The light sensor is located on a top surface of the lens holder. The receiver is located on a plane of the top surface of the lens holder.

In some embodiments, centers of the two cameras are connected into a first line segment. Centers of the receiver and the light sensor are connected into a second line segment. The first line segment is approximately perpendicular to the second line segment. The first line segment passes through a midpoint of the second line segment or the first line segment passes through an endpoint of the second line segment.

In some embodiments, a projection profile of the sound outlet is approximately the same as a projection profile of an inner wall of the display panel surrounding the slot in a direction perpendicular to the cover plate.

In some embodiments, the at least one camera includes a lens holder and a lens barrel coupled to the lens holder. The light sensor and the receiver are located on a top surface of the lens holder.

In some embodiments, the electronic device includes an input/output module. The at least one camera, the light sensor, and the receiver are integrated in the input/output module.

The present disclosure is further related to an electronic device. The electronic device includes a display panel and a touch panel. The display panel includes a display area including a display surface and a back surface opposite to the display surface. The display panel includes at least a void extending through the display surface and the back surface. The at least a void is located in the display area and configured for exposure of at least one component of the electronic device. The display area, except the at least a void, includes a plurality of image pixels. The touch panel is coupled to the display panel.

In some embodiments, the at least one component is selected from the group including at least one camera, a receiver, a light sensor, a projector, a microphone, a speaker, a distance sensor, an illuminator, and a combination thereof.

In some embodiments, the at least a void is at least a notch recessed from an edge of the display panel.

In some embodiments, the at least a void is at least a hole defined in the display panel.

In some embodiments, the at least a hole is located adjacent to an edge of the display panel and spaced from the edge.

In some embodiments, the at least a hole is located adjacent to a middle position of the first edge.

In some embodiments, the electronic device further includes at least one camera facing the at least a hole.

In some embodiments, the at least one camera is at least partially received in the at least a hole.

In some embodiments, the electronic device further includes a receiver. The receiver includes a sound outlet. The sound outlet is located around the at least a hole or arranged inside the at least a hole or arranged outside the at least a hole in a manner other than around the at least a hole.

In some embodiments, a projection profile of the sound outlet is approximately the same as a projection profile of an inner wall of the display panel surrounding the at least a hole.

The present disclosure is further related to an electronic device. The electronic device includes a display panel and a camera. The display panel includes a display area includes a plurality of image pixels. The display area defines a slot extending therethrough in a thickness direction of the display panel. The camera is received in the slot and configured to obtain images from objects outside the electronic device.

In some embodiments, the camera is partially received in the slot of the display panel.

In some embodiments, the camera is surrounded by the display area.

The present disclosure is further related to a display panel. The display panel includes a display area including a plurality of image pixels. The display area defines a slot extending therethrough in a thickness direction of the display panel.

Figure 2:
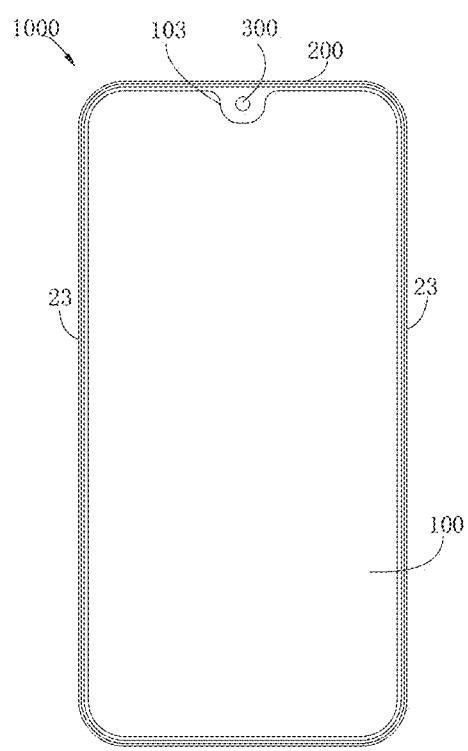
FIG. 2 is a schematic plan view of an electronic device according to an embodiment of the present disclosure.

FIG. 1 and FIG. 2 illustrate an electronic device 1000 according to an embodiment of the present disclosure. The electronic device 1000 may be a mobile phone, a tablet, a notebook computer, a monitor, a navigation equipment, or a smart watch, etc. The electronic device 1000 can include a display assembly 100, a body 200, and a camera 300. In some embodiments, the electronic device 1000 can further include a receiver 400. In the illustrated embodiment, the electronic device 1000 is described as an example of a mobile phone.

Figure 3:
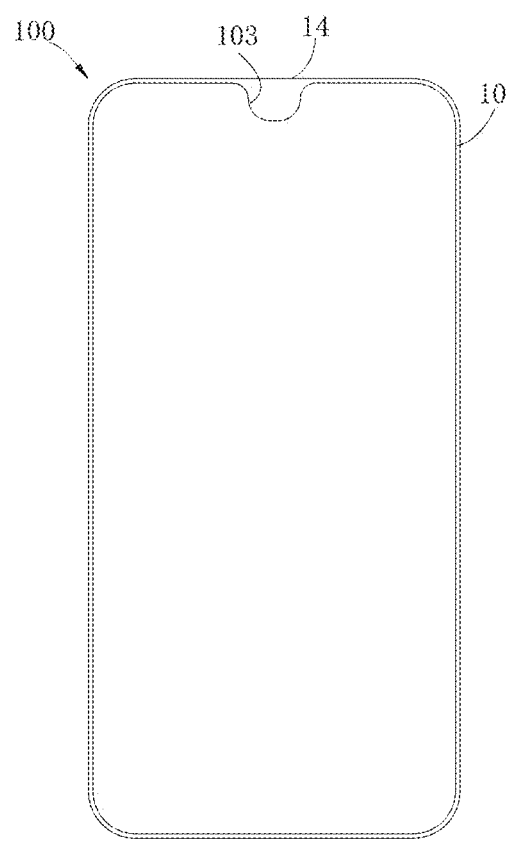
FIG. 3 is a schematic plan view of a display assembly according to an embodiment of the present disclosure.

FIG. 3 illustrates that, in some embodiments, the display assembly 100 is configured to display data information such as a video, an image, a text, an icon, etc. In some embodiments, the display assembly 100 may also be configured to receive touch operation of a user. The display assembly 100 can be a display panel 10. In some embodiments, the display assembly 100 can include the display panel 10, a touch panel 12, and a cover plate 14 (shown in FIG. 45).

Figure 4:
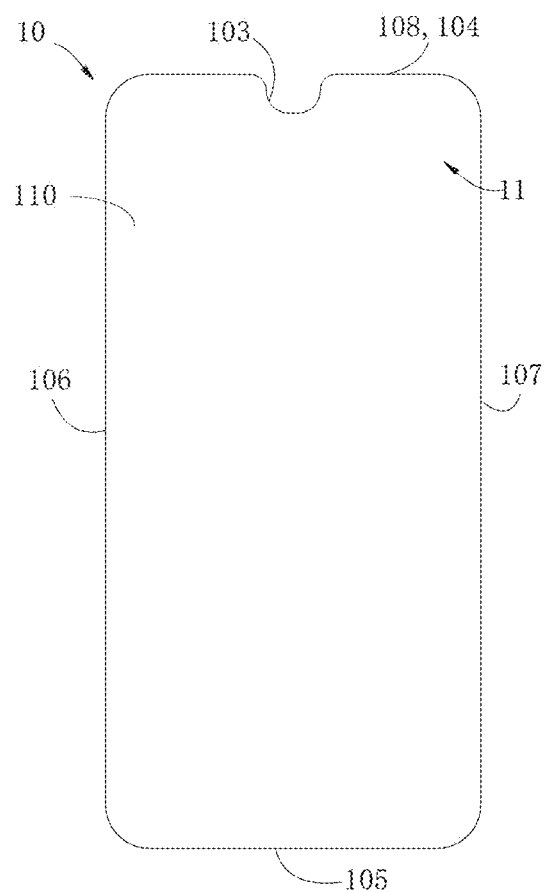
FIG. 4 is a schematic plan view of a display panel according to an embodiment of the present disclosure.
Figure 5:
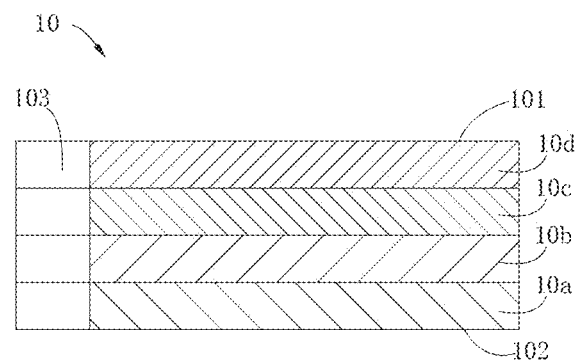
FIG. 5 is a schematic cross-sectional view of a display panel according to an embodiment of the present disclosure.
Figure 6:
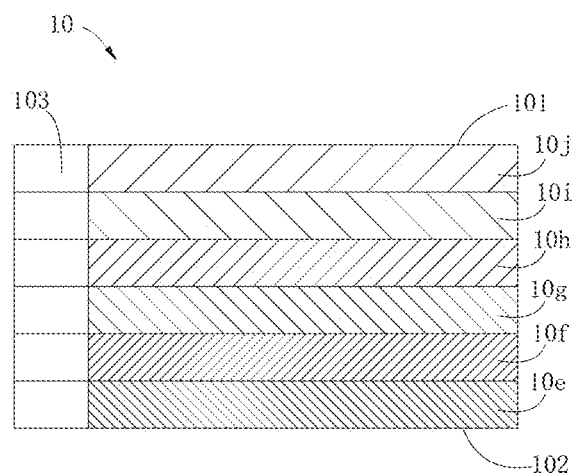
FIG. 6 is a schematic cross-sectional view of a display panel according to an embodiment of the present disclosure.

FIGS. 4 to 6 illustrate that, in some embodiments, the display panel 10 includes a display area 11. The display area includes a display surface 101 and a back surface 102 opposite to the display surface 101. The display panel 10 can be curved or planar. The display panel 10 defines a first slot 103 extending through the display surface 101 and the back surface 102. The first slot 103 extends through the display area 11 in a thickness direction of the display panel. The first slot 103 can be located in the display area 11. The display area 11 can be a full screen display area and includes a plurality of image pixels configured to display data information such as a video, an image, a text, an icon, etc. Referring again to FIG. 2, in some embodiments, in the electronic device 1000, the first slot 103 is corresponding to and receiving the camera 300 of the electronic device 1000 therein. FIGS. 2 and 4 illustrate that, in some embodiments, the camera 300 is surrounded by the display area 11. In some embodiments, in use, regions of the display area 11 at two lateral sides of the first slot 103 may display a status icon of the electronic device 1000 such as battery power, an alarm clock, a signal strength, a Wi-Fi connection, etc. In some embodiments, in use, the regions of the display area 11 at the two lateral sides of the first slot 103 alone or together with the other region of the display area 11 may display other information. Compared with a display area of an electronic device of related art which does not have the slot, the display area 11 of the electronic device 1000 of the illustrated embodiment is large, that is, a screen ratio of the electronic device 1000 is improved without increasing external dimensions of the electronic device 1000.

FIG. 5 illustrates that, in some embodiments, the display panel 10 is an organic light-emitting diode (OLED) display or a flexible OLED display. The display panel 10 includes a cathode plate 10a, an organic light emitting layer 10b, an anode plate 10c, and a polarizer 10d sequentially stacked. In some embodiments, the display surface 101 is a surface of the polarizer 10d remote from the cathode plate 10a, the back surface 102 is a surface of the cathode plate 10a remote from the polarizer 10d, and the first slot 103 penetrates the cathode plate 10a, the organic light emitting layer 10b, the anode plate 10c, and the polarizer 10d.

FIG. 6 illustrates that, in some embodiments, the display panel 10 is a liquid crystal display (LCD). The display panel 10 includes a bottom polarizer 10e, a bottom electrode 10f, a liquid crystal layer 10g, a top electrode 10h, a color filter 10i, and a top polarizer 10j sequentially stacked. In some embodiments, the display surface 101 is a surface of the top polarizer 10j remote from the bottom polarizer 10e, the back surface 102 is a surface of the bottom polarizer 10e remote from the top polarizer 10j, and the first slot 103 penetrates the bottom polarizer 10e, the bottom electrode 10f, the liquid crystal layer 10g, the top electrode 10h, the color filter 10i, and the top polarizer 10j.

FIG. 4 illustrates that, in some embodiments, the display panel 10 includes a top edge 104, a bottom edge 105, a left edge 106, and a right edge 107. In some embodiments, the top edge 104 connects the left edge 106 and the right edge 107, the bottom edge 105 is opposite to the top edge 104 and connects the left edge 106 and the right edge 107, and the top edge 104, the left edge 106, the bottom edge 105, and the right edge 107 are connected in turn as edges of the display panel 10. In some embodiments, the display panel 10 is a rounded rectangle, that is, four right angles of the rectangle are replaced by four round angles. The top edge 104 and the bottom edge 105 are two edges opposite to each other. The left edge 106 and the right edge 107 are also two edges opposite to each other. It is to be understood that, the shape of the display panel 10 is not limited to the above discussion, and may be other shapes such as a rounded shape as a whole, an elliptical shape as a whole, a rectangular shape as a whole, etc.

Figure 7:
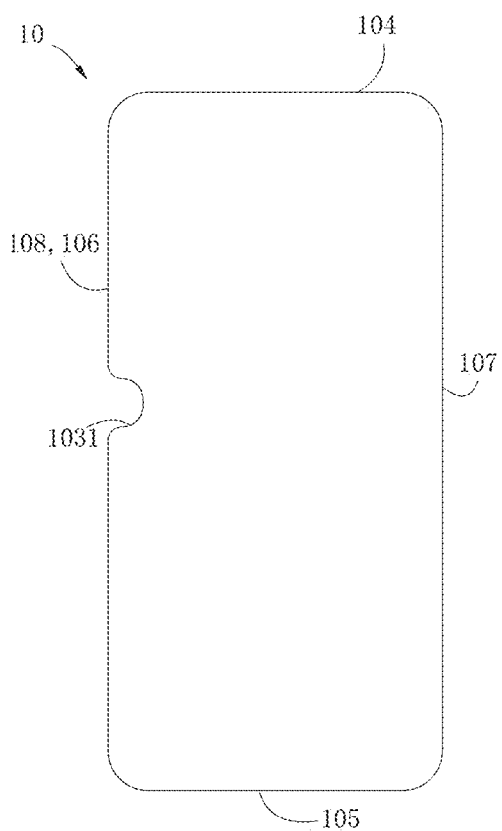
FIG. 7 is a schematic plan view of a display panel according to an embodiment of the present disclosure.
Figure 8:
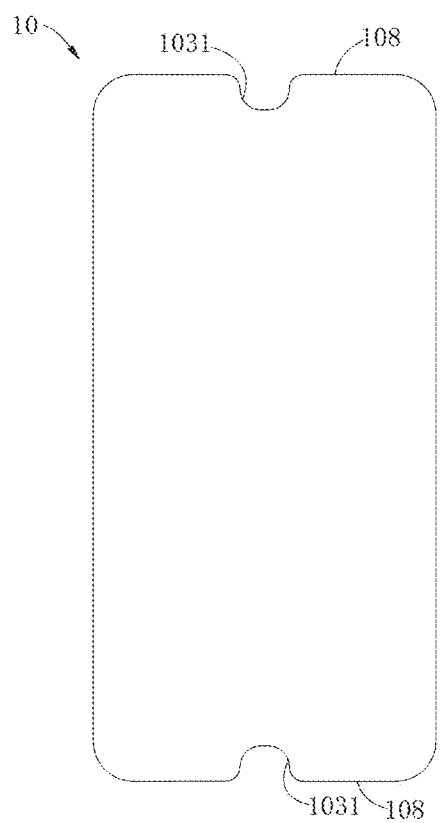
FIG. 8 is a schematic plan view of a display panel according to an embodiment of the present disclosure.
Figure 9:
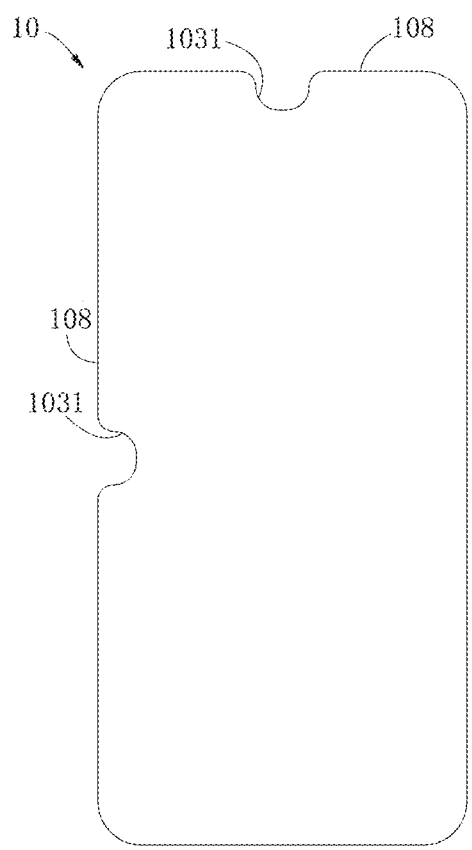
FIG. 9 is a schematic plan view of a display panel according to an embodiment of the present disclosure.
Figure 10:
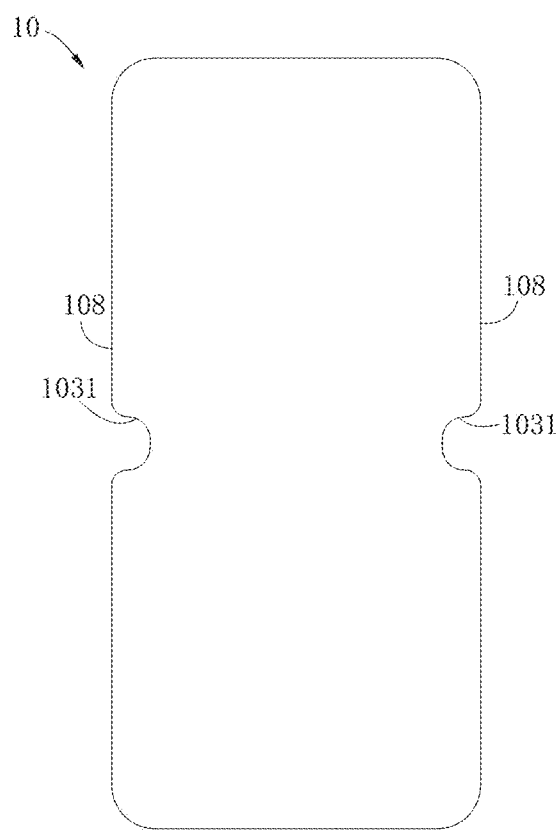
FIG. 10 is a schematic plan view of a display panel according to an embodiment of the present disclosure.
Figure 11:
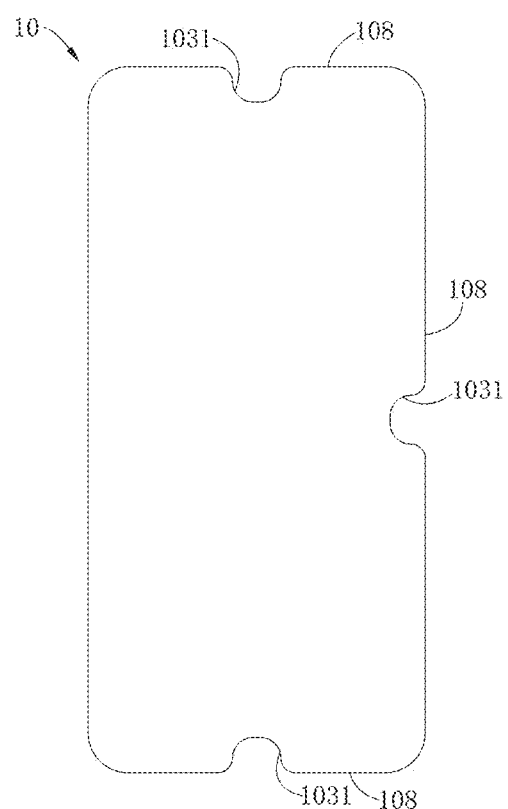
FIG. 11 is a schematic plan view of a display panel according to an embodiment of the present disclosure.
Figure 12:
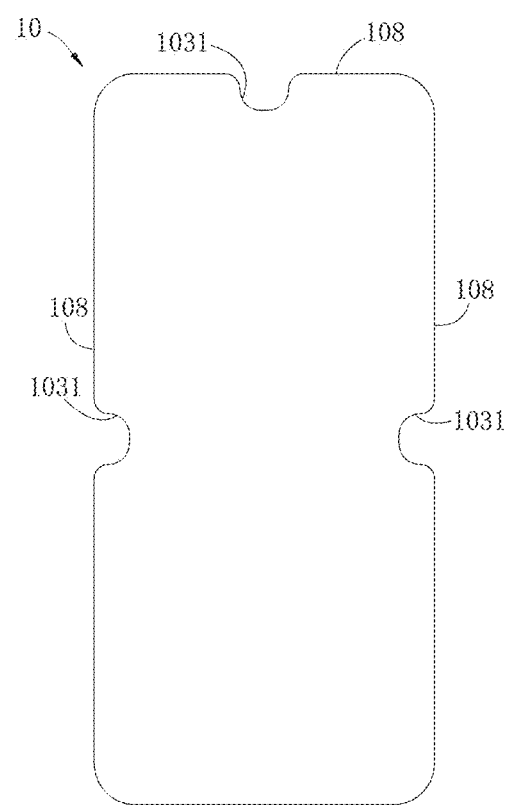
FIG. 12 is a schematic plan view of a display panel according to an embodiment of the present disclosure.
Figure 13:
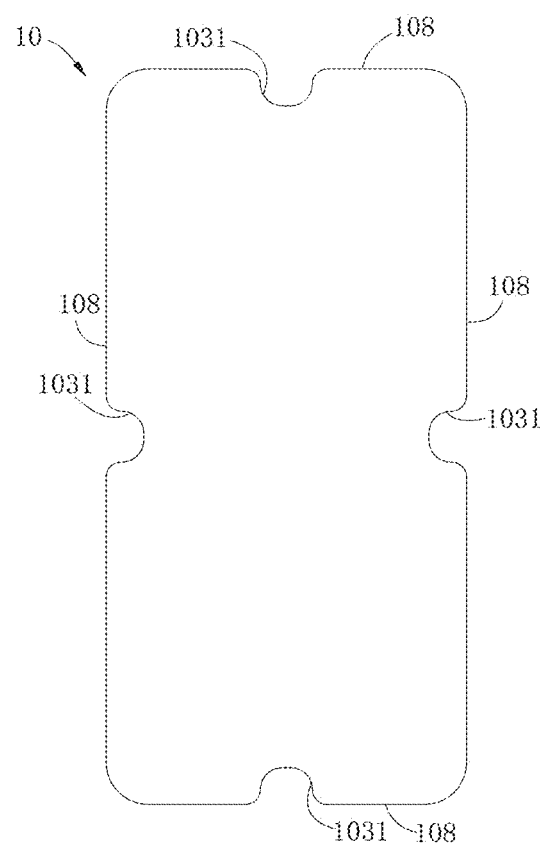
FIG. 13 is a schematic plan view of a display panel according to an embodiment of the present disclosure.
Figure 14:
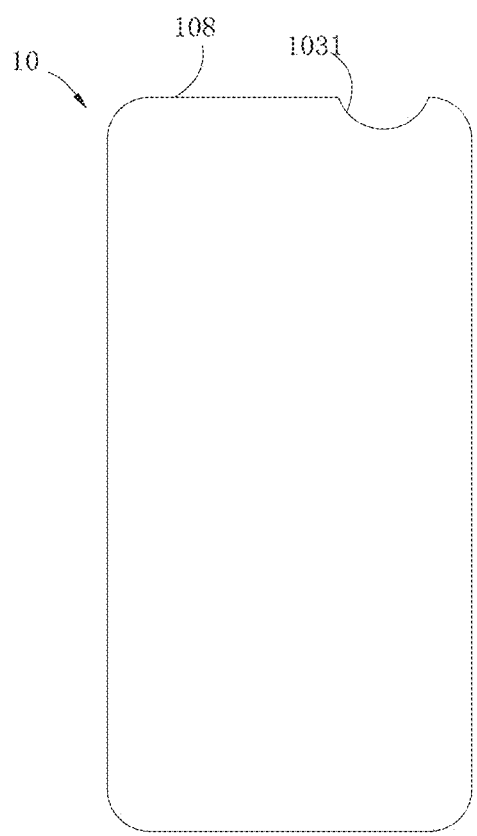
FIG. 14 is a schematic plan view of a display panel according to an embodiment of the present disclosure.

FIGS. 4 and 7 illustrate that, in some embodiments, the display panel 10 includes a first edge 108 and a main body 110. The display panel 10 defines at least one first slot 103. The first slot 103 includes a notch 1031 with an opening defined at the first edge 108. The notch 1031 is concaved from the first edge 108 toward the main body 110 of the display panel 10. In the illustrated embodiment, each first slot 103 includes one notch 1031 concaved from the first edge 108. In some embodiments, each first slot 103 can include a plurality of notch 1031 communicating with each other and concaved from the first edge 108. The first edge 108 may be one or more of the top edge 104, the bottom edge 105, the left edge 106, and the right edge 107. That is, FIGS. 4 and 7 illustrate that, the notch 1031 may be concaved from any one of the top edge 104, the bottom edge 105, the left edge 106, and the right edge 107, and the number of the notch 1031 is one. FIGS. 8 to 10 illustrate that, the notches 1031 may also be concaved at any two of the top edge 104, the bottom edge 105, the left edge 106, and the right edge 107, and the number of the notches 1031 is two. FIGS. 11 and 12 illustrate that, the notches 1031 may be concaved from any three of the top edge 104, the bottom edge 105, the left edge 106, and the right edge 107, and the number of notches 1031 may be three. FIG. 13 illustrates that, the notch 1031 may be concaved from the top edge 104, the bottom edge 105, the left edge 106, and the right edge 107, and the number of notches 1031 is four. FIG. 14 illustrates that, the shape of the notch 1031 in a plane where the display surface 101 is substantially located may be semicircular, parabolic, rectangular, elliptical or a portion thereof, triangular, etc. In some embodiments, the notch 1031 is concaved from a middle position of the first edge 108. It is to be understood that, the notch 1031 may also be concaved from other locations of the first edge 108, such as from an end of the first edge 108, or from any other location between the end and the middle position of the first edge 108.

Figure 15:
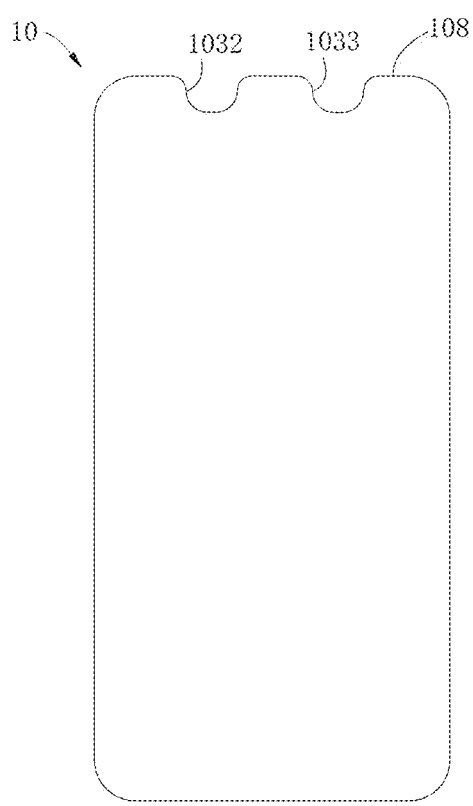
FIG. 15 is a schematic plan view of a display panel according to an embodiment of the present disclosure.
Figure 16:
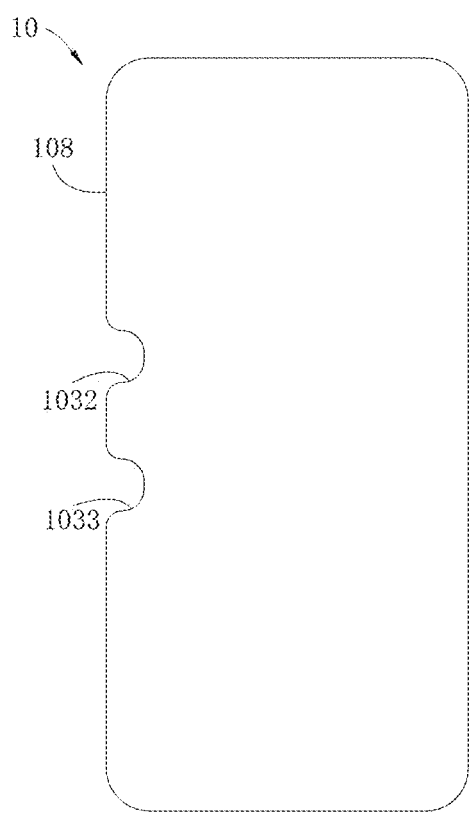
FIG. 16 is a schematic plan view of a display panel according to an embodiment of the present disclosure.
Figure 17:
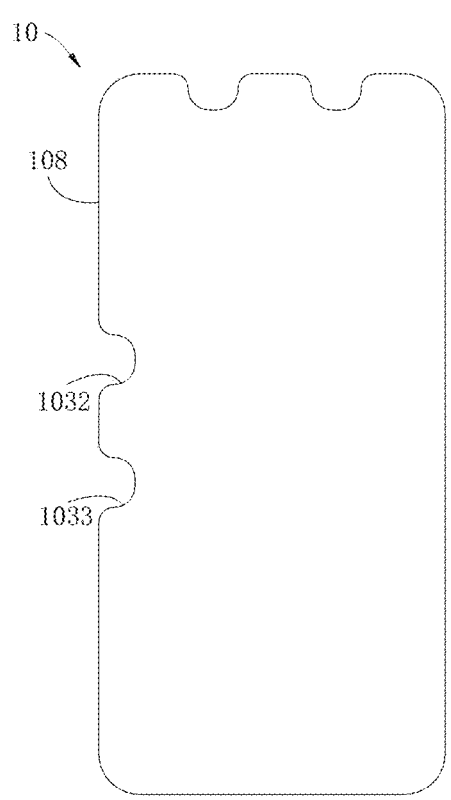
FIG. 17 is a schematic plan view of a display panel according to an embodiment of the present disclosure.
Figure 18:
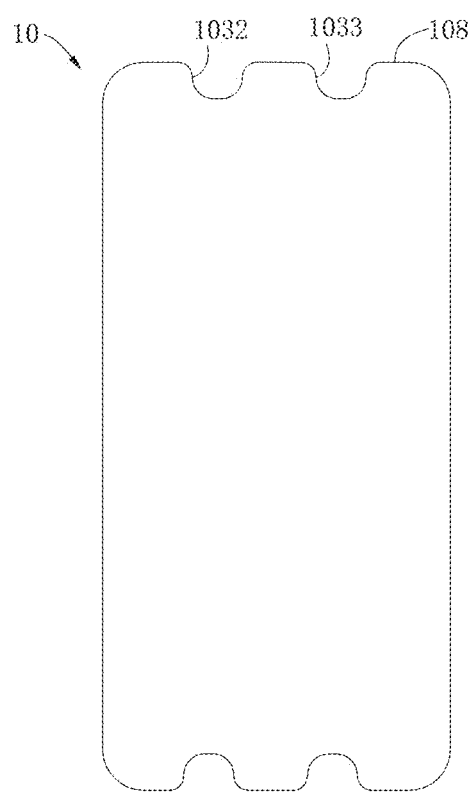
FIG. 18 is a schematic plan view of a display panel according to an embodiment of the present disclosure.
Figure 19:
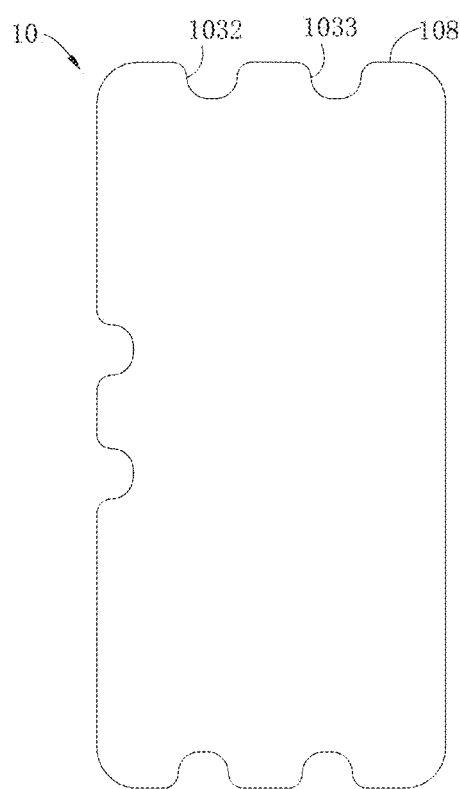
FIG. 19 is a schematic plan view of a display panel according to an embodiment of the present disclosure.
Figure 20:
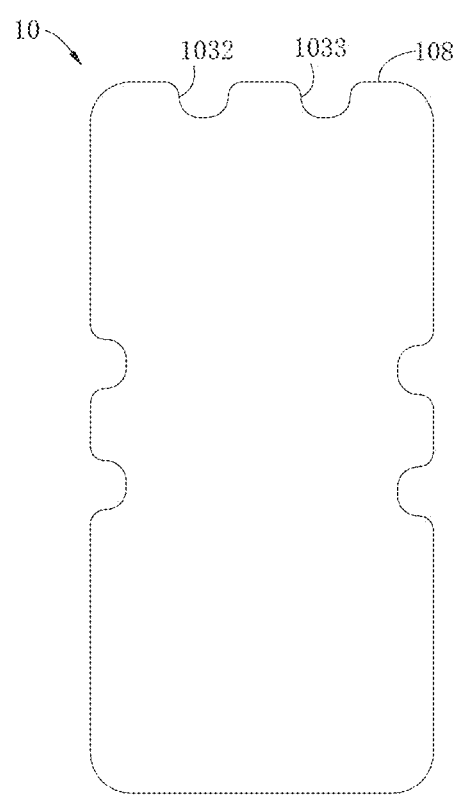
FIG. 20 is a schematic plan view of a display panel according to an embodiment of the present disclosure.
Figure 21:
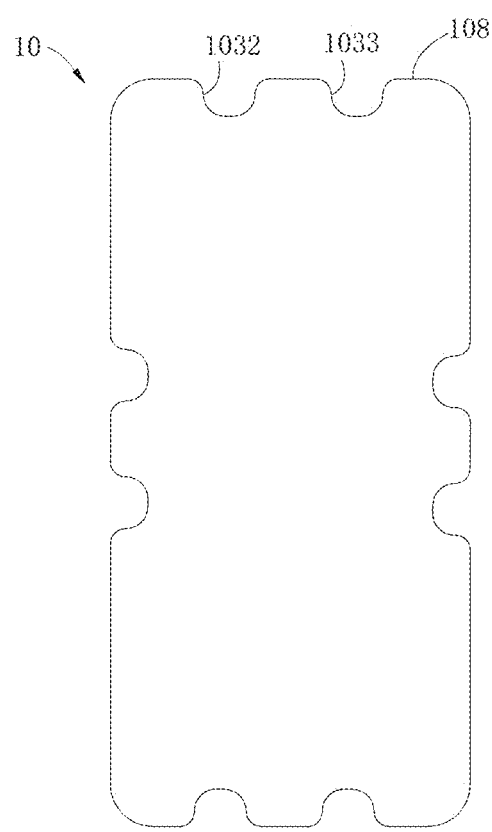
FIG. 21 is a schematic plan view of a display panel according to an embodiment of the present disclosure.
Figure 22:
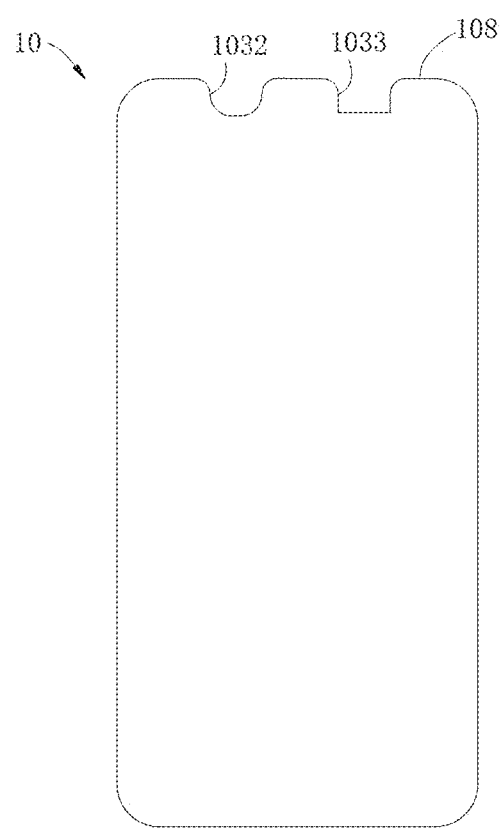
FIG. 22 is a schematic plan view of a display panel according to an embodiment of the present disclosure.
Figure 23:
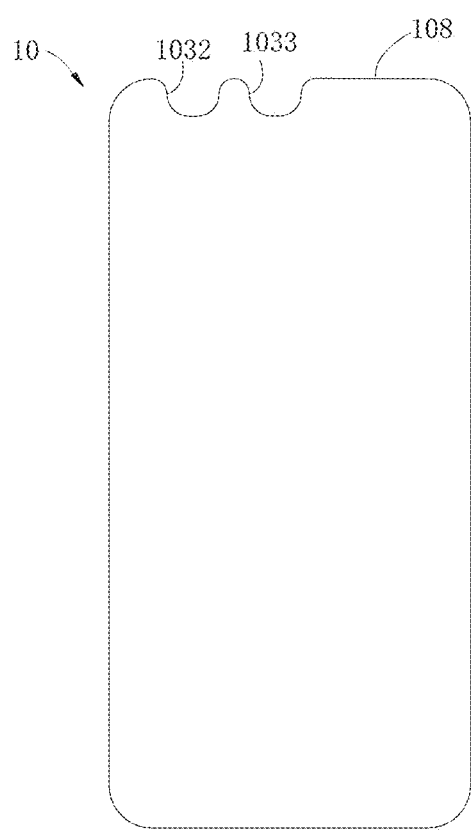
FIG. 23 is a schematic plan view of a display panel according to an embodiment of the present disclosure.

FIG. 15 illustrates that the display panel 10 defines a plurality of first slots 103. The first slots 103 include a first notch 1032 and a second notch 1033 concaved from the first edge 108. The first edge 108 may be one or more of the top edge 104, the bottom edge 105, the left edge 106, and the right edge 107. FIGS. 15 and 16 illustrate that, the first notch 1032 and the second notch 1033 may be concaved from any one of the top edge 104, the bottom edge 105, the left edge 106, and the right edge 107. The first notch 1032 and the second notch 1033 are each one in number. FIGS. 17 and 18 illustrate that, the first notches 1032 and the second notches 1033 may also be located at any two of the top edge 104, the bottom edge 105, the left edge 106, and the right edge 107, and the first notches 1032 and the notches 1033 are each two in number. FIGS. 19 and 20 illustrate that, the first notches 1032 and the second notches 1033 may also be concaved from any three of the top edge 104, the bottom edge 105, the left edge 106, and the right edge 107, and the first notches 1032 and the second notches 1033 are each three in number. FIG. 21 illustrates that, the first notches 1032 and the second notches 1033 may be concaved from the top edge 104, the bottom edge 105, the left edge 106, and the right edge 107, and the first notches 1032 and the second notches 1033 are each four in number. Shapes of the first notch 1032 and the second notch 1033 in the plane where the display surface 101 is substantially located may be semicircular, parabolic, rectangular, elliptical, triangular, etc., and shapes of the first notch 1032 and the second notch 1033 may be approximately the same. FIG. 22 illustrates that, the first notch 1032 and the second notch 1033 may be different; for example, the shape of the first notch 1032 in the plane where the display surface 101 is substantially located is semicircular and the shape of the second notch 1033 in the plane where the display surface 101 is substantially located is rectangular, or the shape of the first notch 1032 in the plane where the display surface 101 is substantially located is elliptical and the shape of the second notch 1033 in the plane where the display surface 101 is substantially located is rectangular, etc. In some embodiments, the first notch 1032 and the second notch 1033 are concaved from a middle position of the first edge 108, that is, a midpoint of a line segment formed by connecting centers of the first notch 1032 and the second notch 1033 is concaved from a middle position of the first edge 108. Distance between centers of the first notch 1032 and the second notch 1033 may account for half, one third or other proportion of a length of the first edge 108. It is to be understood that, FIG. 23 illustrates that, the first notch 1032 and the second notch 1033 may not be concaved from a middle position of the first edge 108; for example, the first notch 1032 and the second notch 1033 are concaved from one third of the first edge 108 from one end of the first edge 108.

Figure 24:
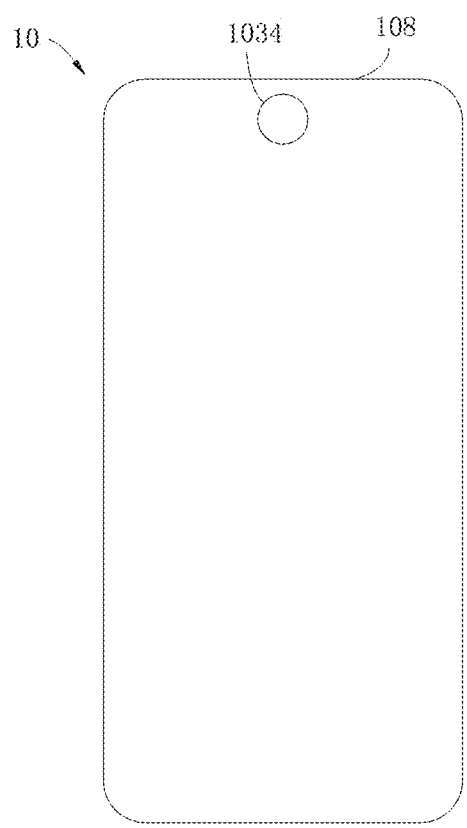
FIG. 24 is a schematic plan view of a display panel according to an embodiment of the present disclosure.
Figure 25:
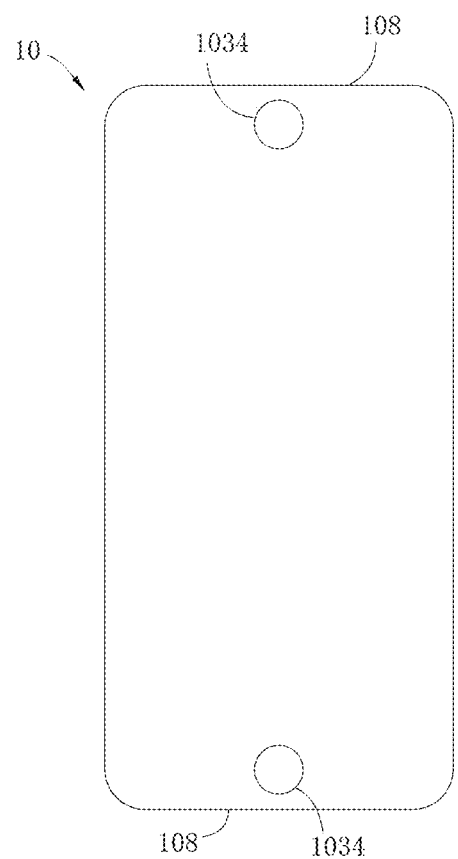
FIG. 25 is a schematic plan view of a display panel according to an embodiment of the present disclosure.
Figure 26:
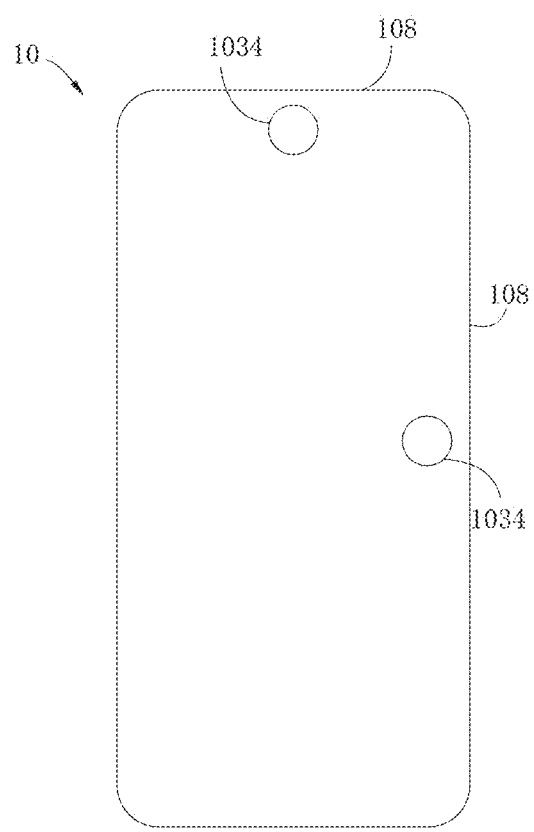
FIG. 26 is a schematic plan view of a display panel according to an embodiment of the present disclosure.
Figure 27:
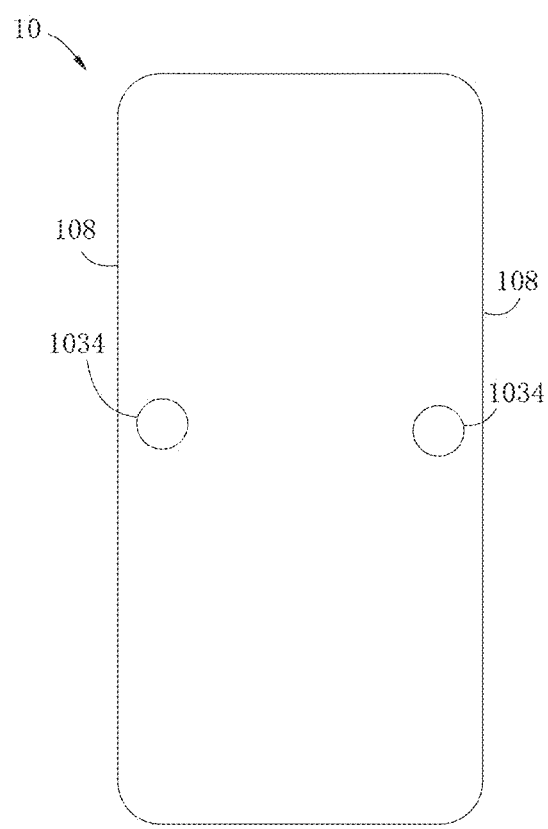
FIG. 27 is a schematic plan view of a display panel according to an embodiment of the present disclosure.
Figure 28:
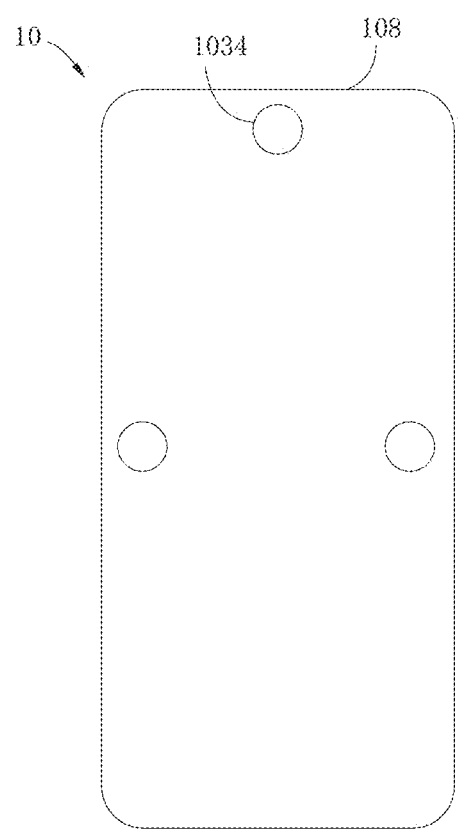
FIG. 28 is a schematic plan view of a display panel according to an embodiment of the present disclosure.
Figure 29:
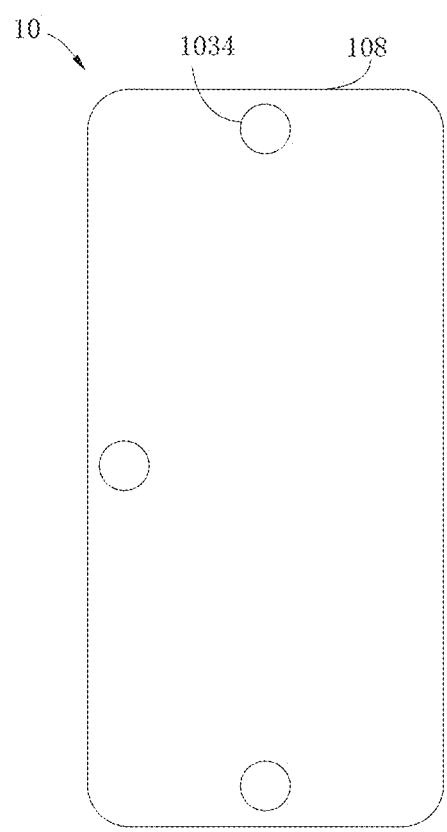
FIG. 29 is a schematic plan view of a display panel according to an embodiment of the present disclosure.
Figure 30:
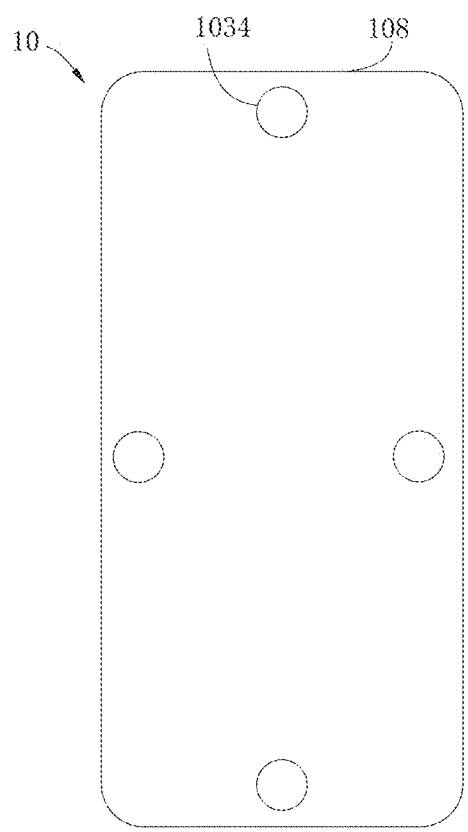
FIG. 30 is a schematic plan view of a display panel according to an embodiment of the present disclosure.
Figure 31:
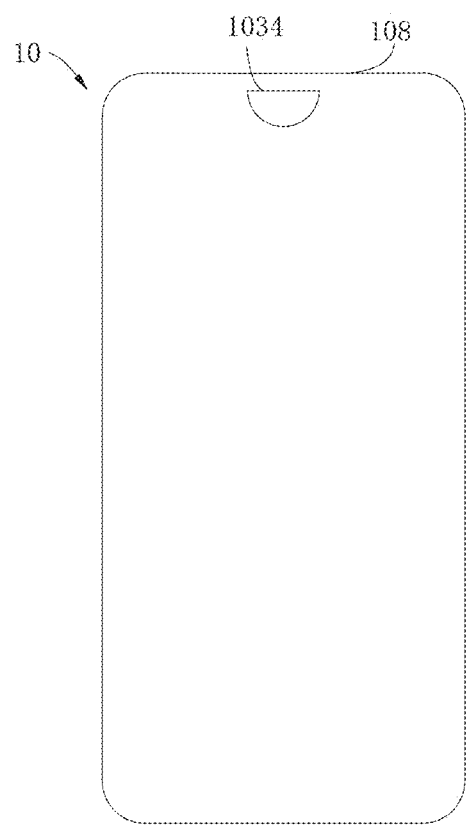
FIG. 31 is a schematic plan view of a display panel according to an embodiment of the present disclosure.
Figure 32:
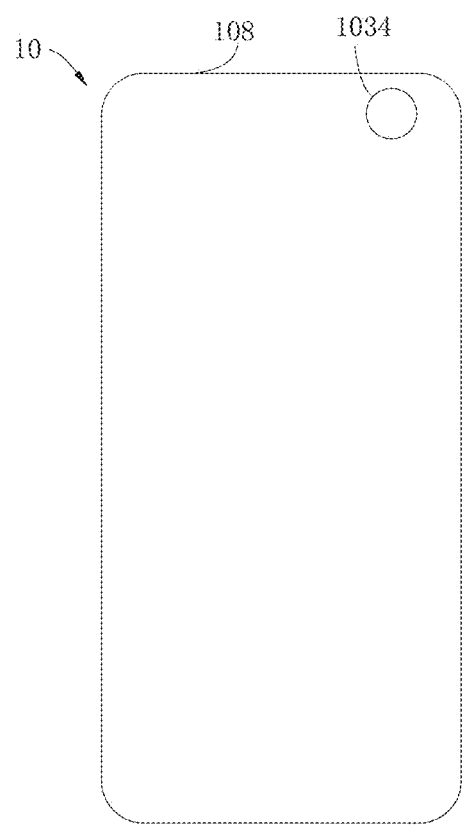
FIG. 32 is a schematic plan view of a display panel according to an embodiment of the present disclosure.

In some embodiments, the first slot 103 is surrounded by the display area 11. The first slot 103 can include a hole 1034 adjacent to the first edge 108 and spaced from the first edge 108. FIG. 24 illustrates that, the first edge 108 may be one or more of the top edge 104, the bottom edge 105, the left edge 106, and the right edge 107, that is, the hole 1034 may be located adjacent to one of the top edge 104, the bottom edge 105, the left edge 106, and the right edge 107 and spaced from the one, and the number of the hole 1034 is one. FIGS. 25 to 27 illustrate that, the holes 1034 may also be located adjacent to two of the top edge 104, the bottom edge 105, the left edge 106, and the right edge 107 and spaced from the two, and the number of holes 1034 is two. FIGS. 28 and 29 illustrate that, the holes 1034 may also be located adjacent to three of the top edge 104, the bottom edge 105, the left edge 106, and the right edge 107 and spaced from the three, the number of the holes 1034 is three. FIG. 30 illustrates that, the holes 1034 may be located adjacent to the top edge 104, the bottom edge 105, the left edge 106, and the right edge and spaced from the top edge 104, the bottom edge 105, the left edge 106, and the right edge 107, and the number of the holes 1034 is four. FIG. 31 illustrates that, shape of the hole 1034 in the plane where the display surface 101 is substantially located may be semicircular. It is to be understood that, in other embodiments, shape of the hole 1034 in the plane where the display surface 101 is substantially located may be regular hexagonal, octagonal, rectangular, elliptical, triangular, etc. In some embodiments, the hole 1034 is located adjacent to a middle position of the first edge 108. It is to be understood that, FIG. 32 illustrates that, the hole 1034 may also be adjacent to other location of the first edge 108, such as adjacent to an end of the first edge 108.

Figure 33:
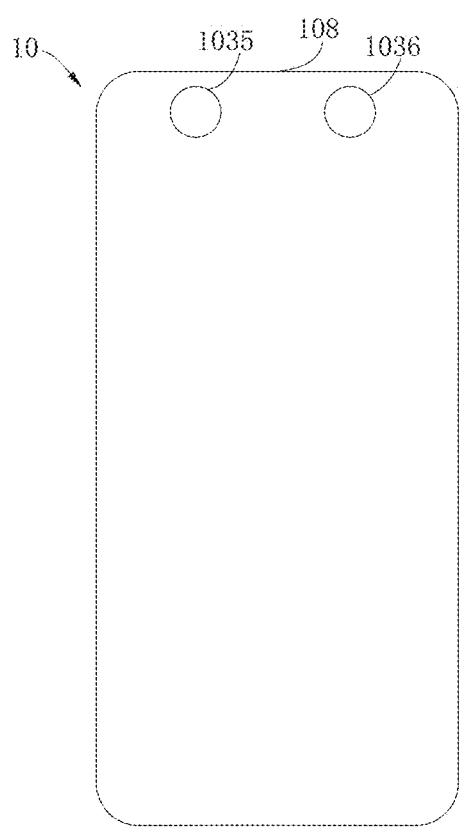
FIG. 33 is a schematic plan view of a display panel according to an embodiment of the present disclosure.
Figure 34:
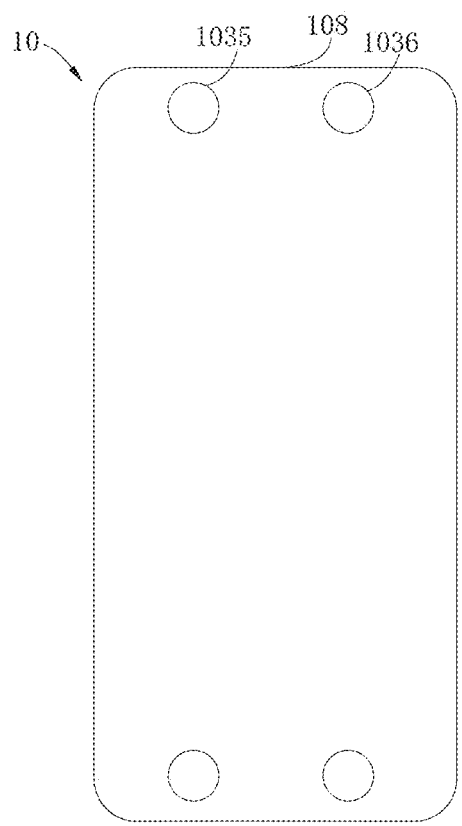
FIG. 34 is a schematic plan view of a display panel according to an embodiment of the present disclosure.
Figure 35:
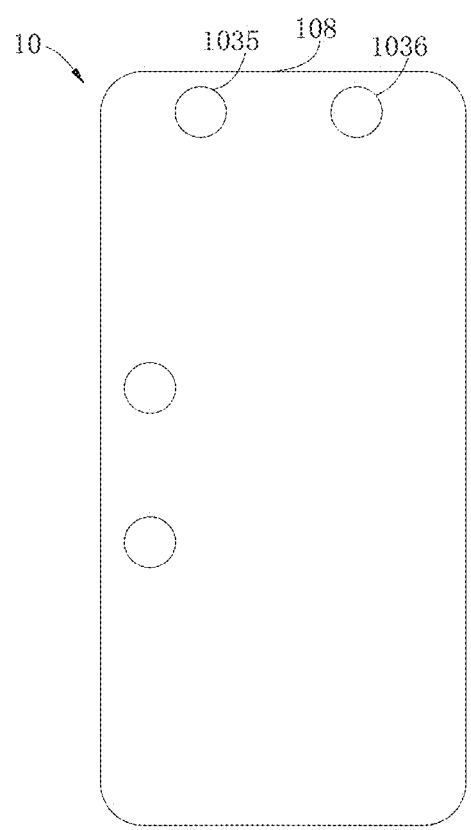
FIG. 35 is a schematic plan view of a display panel according to an embodiment of the present disclosure.
Figure 36:
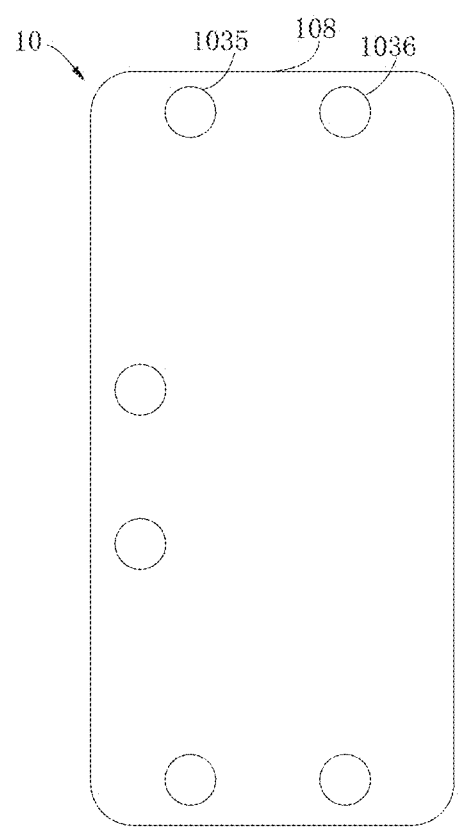
FIG. 36 is a schematic plan view of a display panel according to an embodiment of the present disclosure.
Figure 37:
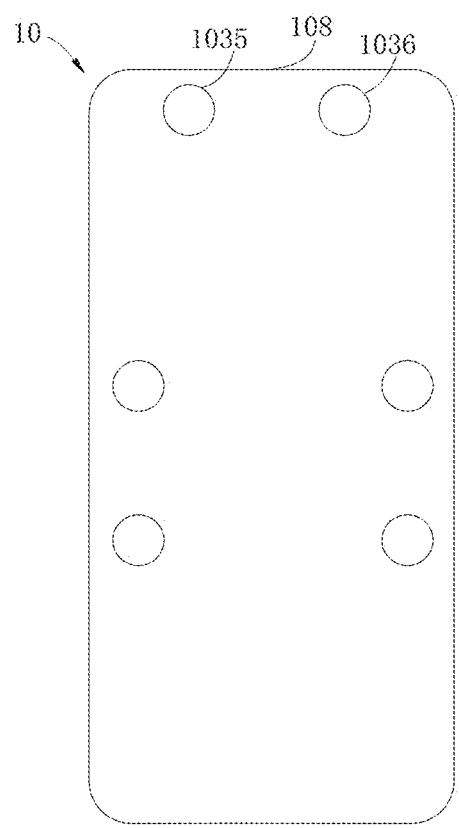
FIG. 37 is a schematic plan view of a display panel according to an embodiment of the present disclosure.
Figure 38:
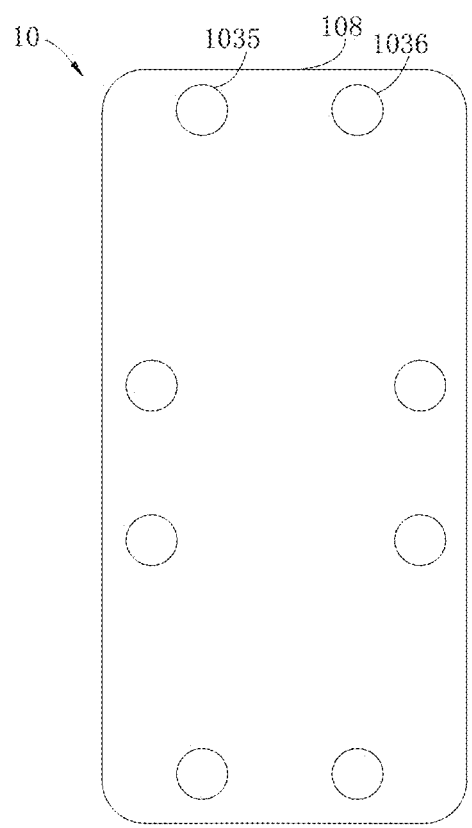
FIG. 38 is a schematic plan view of a display panel according to an embodiment of the present disclosure.
Figure 39:
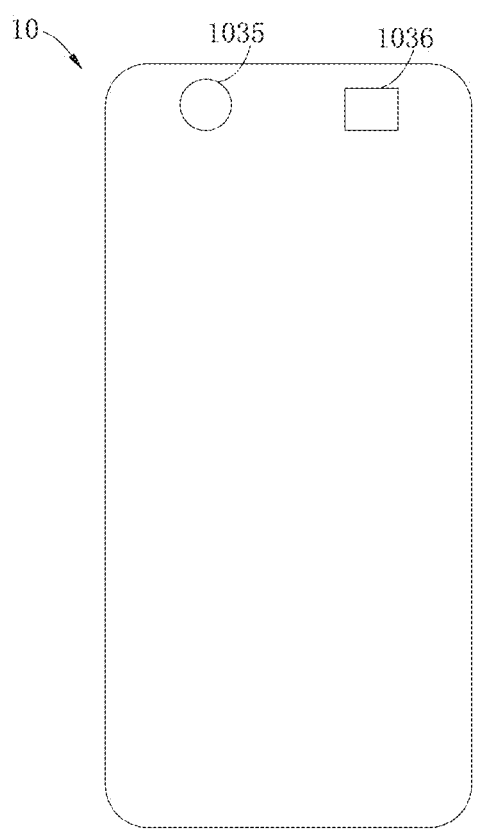
FIG. 39 is a schematic plan view of a display panel according to an embodiment of the present disclosure.
Figure 40:
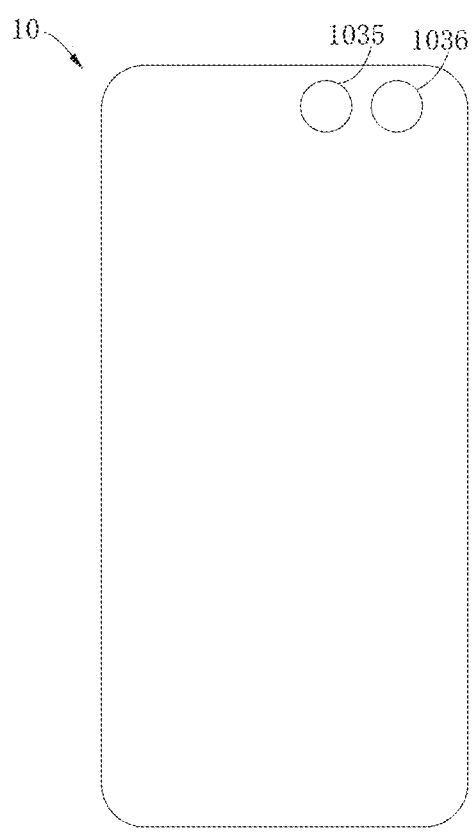
FIG. 40 is a schematic plan view of a display panel according to an embodiment of the present disclosure.

FIG. 33 illustrates that, in some embodiments, the display panel 11 can define a plurality of first slots 103. The first slots 103 include a first hole 1035 and a second hole 1036 adjacent to the first edge 108 and spaced from the first edge 108. The first edge 108 may be one or more of the top edge 104, the bottom edge 105, the left edge 106, and the right edge 107, that is, the first hole 1035 and the second hole 1036 may be located adjacent to one of the top edge 104, the bottom edge 105, the left edge 106, and the right edge 107 and spaced from the one, and the first hole 1035 and the second hole 1036 are each one in number. FIGS. 34 and 35 illustrate that, the first holes 1035 and the second holes 1036 may also be located adjacent to two of the top edge 104, the bottom edge 105, the left edge 106, and the right edge 107 and spaced from the two, and the first holes 1035 and the second holes 1036 are each two in number. FIGS. 36 and 37 illustrate that, the first holes 1035 and the second holes 1036 may also be located adjacent to three of the top edge 104, the bottom edge 105, the left edge 106, and the right edge 107 and spaced from the three, the first holes 1035 and the second holes 1036 are each three in number. FIG. 38 illustrates that, the first holes 1035 and the second holes 1036 may be located adjacent to the top edge 104, the bottom edge 105, the left edge 106, and the right edge and spaced from the top edge 104, the bottom edge 105, the left edge 106, and the right edge 107, and the first holes 1035 and the second holes 1036 are each four in number. Shapes of the first holes 1035 and the second holes 1036 in the plane where the display surface 101 is substantially located may be circular, semicircular, regular hexagonal, octagonal, rectangular, elliptical, triangular, etc. Shapes of the first hole 1035 and the second hole 1036 may be approximately the same, and shapes of the first hole 1035 and the second hole 1036 may be different. For example, FIG. 39 illustrates that, shape of the first hole 1035 in the plane where the display surface 101 is substantially located is circular and shape of the second hole 1036 in the plane where the display surface 101 is substantially located is rectangular, or shape of the first hole 1035 in the plane where the display surface 101 is substantially located is circular and shape of the second hole 1036 in the plane where the display surface 101 is substantially located is elliptical, etc. In some embodiments, the first hole 1035 and the second hole 1036 are located adjacent to a middle position of the first edge 108, that is, a midpoint of a line segment formed by connecting centers of the first hole 1035 and the second hole 1036 is adjacent to a middle position of the first edge 108. It is to be understood that, FIG. 40 illustrates that, the first hole 1035 and the second hole 1036 may not be adjacent to a middle position of the first edge 108, for example, the first hole 1035 and the second hole 1036 are located adjacent to one third of the first edge 108 from one end of the first edge 108.

Figure 41:
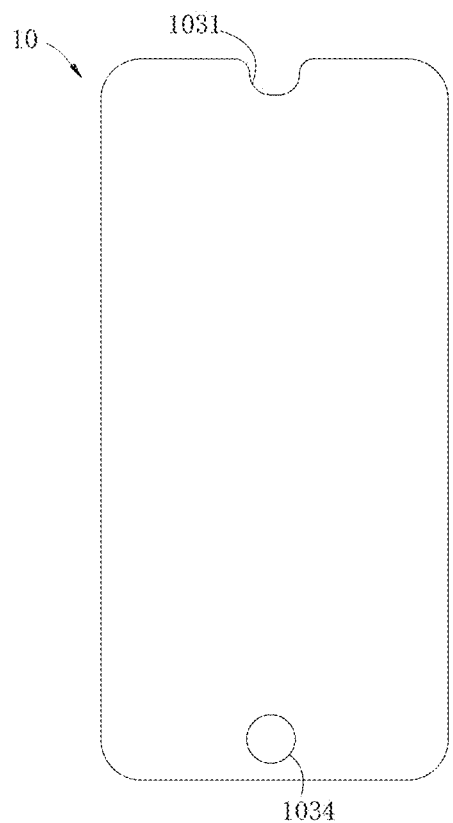
FIG. 41 is a schematic plan view of a display panel according to an embodiment of the present disclosure.
Figure 42:
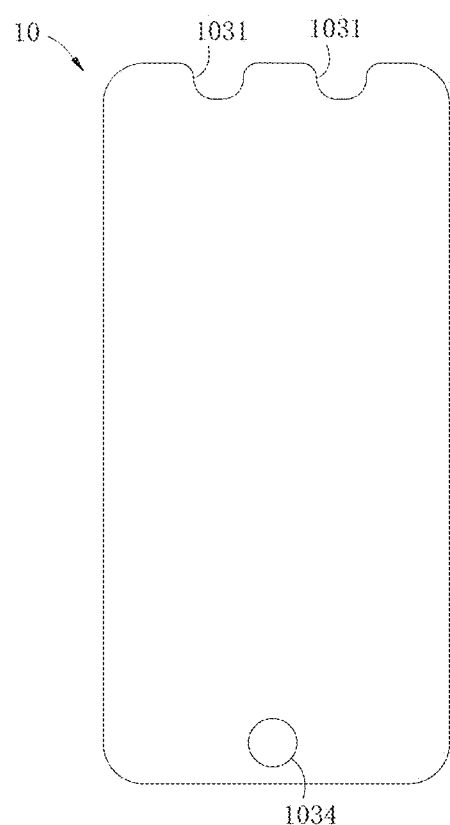
FIG. 42 is a schematic plan view of a display panel according to an embodiment of the present disclosure.
Figure 43:
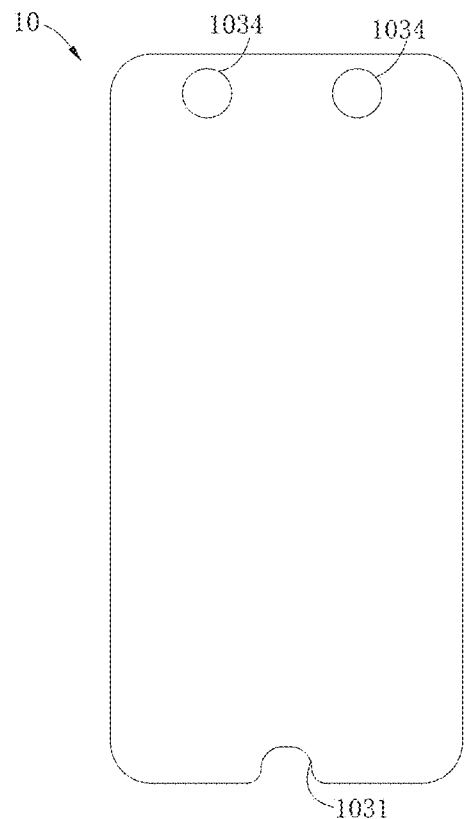
FIG. 43 is a schematic plan view of a display panel according to an embodiment of the present disclosure.

FIGS. 41 to 43 illustrate that, it is to be understood that, in other embodiments, the first slots 103 includes both the notch 1031 and the hole 1034. In detail, the notch 1031 may be concaved from the top edge 104, the hole 1034 is located adjacent to the bottom edge 105 and spaced from the bottom edge 105, or the notch 1031 may be concaved from the top edge 104, the hole 1034 is located adjacent to the top edge 104 and spaced from the top edge 104. The number of the notch 1031 and the hole 1034 of the first slots 103 is not limited to the above discussion, and may be a notch 1031 and two holes 1034, a notch 1031 and three holes 1034, two notches 1031 and one hole 1034, three notches 1031 and one hole 1034, or three notches 1031 and three holes 1034, etc. Areas of the notch 1031 and the hole 1034 may be arranged and selected according to production requirements, for example, sizes of the plurality of notches 1031 may be approximately the same or not approximately the same, sizes of the plurality of holes 1034 may be approximately the same or not approximately the same, sizes of the plurality of notches 1031 and the plurality of holes 1034 may be approximately the same or not approximately the same.

FIGS. 44 to 49 illustrate that, the touch panel 12 is located on the display panel 10, and in detail, the touch panel 12 is located on the display surface 101 and away from the back surface 102.

Figure 44:
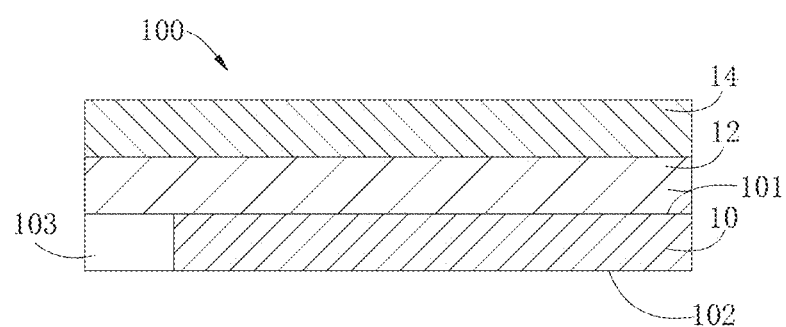
FIG. 44 is a schematic cross-sectional view of a display assembly according to an embodiment of the present disclosure.
Figure 45:
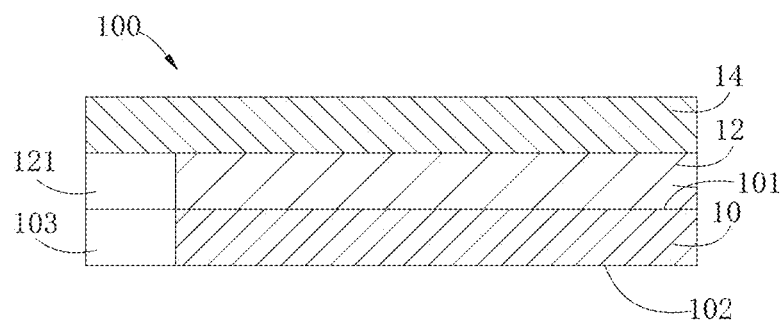
FIG. 45 is a schematic cross-sectional view of a display assembly according to an embodiment of the present disclosure.
Figure 46:
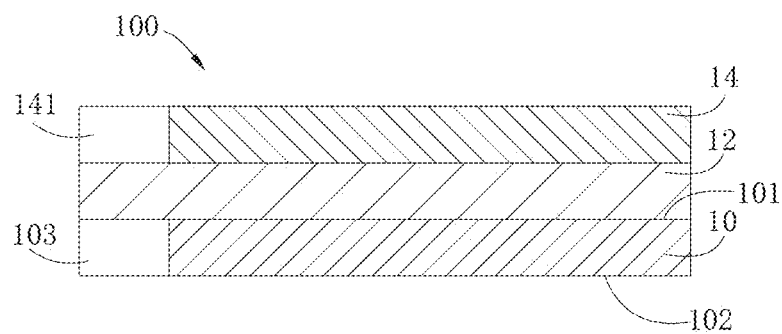
FIG. 46 is a schematic cross-sectional view of a display assembly according to an embodiment of the present disclosure.
Figure 47:
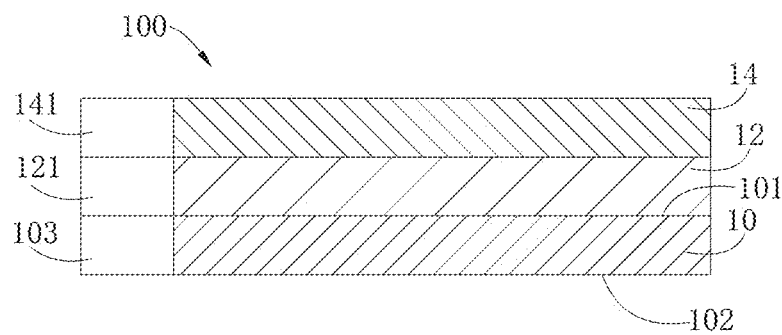
FIG. 47 is a schematic cross-sectional view of a display assembly according to an embodiment of the present disclosure.

FIG. 44 illustrates that, in some embodiments, the cover plate 14 is located on the touch panel 12 and on a side of the touch panel 12 opposite to the display panel 10, that is, the display panel 10, the touch panel 12, and the cover plate 14 are sequentially stacked. In some embodiments, the touch panel 12 and the cover plate 14 cover the first slot 103. FIG. 45 illustrates that, in some embodiments, the touch panel 12 includes a second slot 121 corresponding to the first slot 103, and the cover plate 14 covers the first slot 103 and the second slot 121. Shapes and sizes of the second slot 121 and the first slot 103 may be approximately the same or not approximately the same. FIG. 46 illustrates that, in some embodiments, the cover plate 14 defines a third slot 141 corresponding to the first slot 103. The touch panel 12 is spaced from the first slot 103 and the third slot 141, and the shapes and sizes of the third slot 141 and the first slot 103 may be approximately the same or not approximately the same. FIG. 47 illustrates that, in some embodiments, the touch panel 12 includes a second slot 121 corresponding to the first slot 103 and the cover plate 14 defines a third slot 141 corresponding to the first slot 103. Shapes and sizes of the first slot 103, the second slot 121, and the third slot 141 may be approximately the same or not approximately the same.

Figure 48:
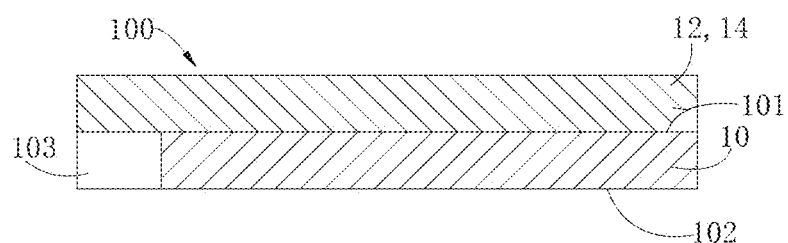
FIG. 48 is a schematic cross-sectional view of a display assembly according to an embodiment of the present disclosure.
Figure 49:
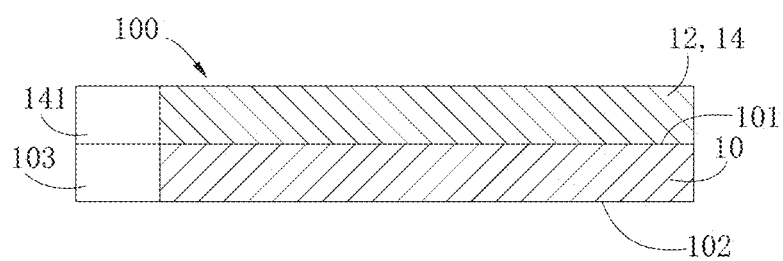
FIG. 49 is a schematic cross-sectional view of a display assembly according to an embodiment of the present disclosure.

FIG. 48 illustrates that, in some embodiments, the touch panel 12 is integrated in the cover plate 14, in other words, touch line is integrated in the cover plate 14, and the touch panel 14 is clicked to perform touch performance. The cover plate 14 may be made of glass, sapphire, polyvinyl chloride (PVC), etc. In some embodiments, the cover plate 14 covers the first slot 103. FIG. 49 illustrates that, in some embodiments, the cover plate 14 defines a third slot 141 corresponding to the first slot 103. It is to be understood that, in the embodiment, the touch panel 12 is integrated in the cover plate 14, the third slot 141 formed in the cover plate 14 also penetrates the touch panel 12. Shapes and sizes of the third slot 141 and the first slot 103 may be approximately the same or not approximately the same.

Figure 50:
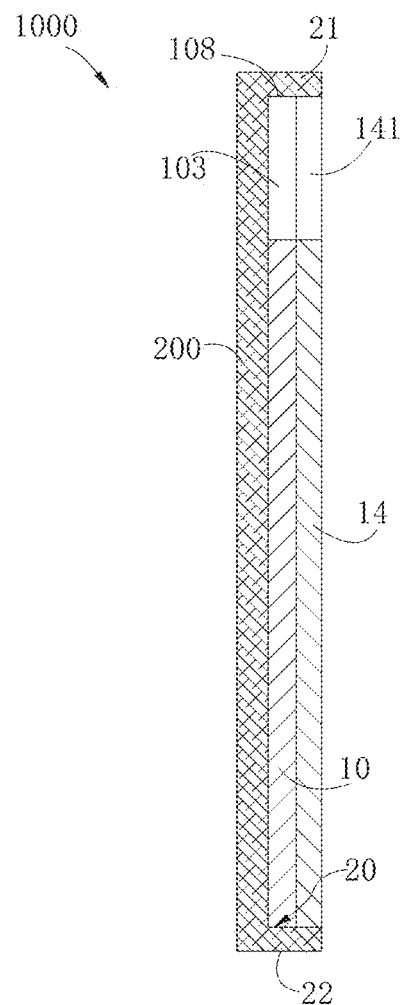
FIG. 50 is a schematic cross-sectional view of an electronic device according to an embodiment of the present disclosure.

FIGS. 1, 2, and 50 illustrate that, the body 200 may be as a mounting carrier of assembly elements of the electronic device 1000, such as the display assembly 100, the camera 300, the receiver 400, etc. of the electronic device 1000 mounted on the body 200. The body 200 also provides protection for the electronic device 1000, for example, when the electronic device 1000 is dropped or squeezed, the electronic device 1000 is not easily disassembled or deformed, or the electronic device 1000 is prevented from being damaged by rain and dust. In some embodiments, the body 200 is connected to the cover plate 14. In detail, the cover plate 14 is located on the body 200 and cooperates with the body 200 to form an accommodation space, the display panel 10 is located in the accommodation space 20. In more detail, the body 200 includes a top part 21, a bottom part 22, and a side part 23 connecting the top part 21 and the bottom part 22. The cover plate 14 is fixed between the top part 21, the bottom part 22, and the side part 23. In some embodiments, the top part 21 and the side part 23 are flat and the top part 21 intersects the cover plate 14 at a right angle or an acute angle. The top part 21 and the side part 23 may also be a cylindrical side shape and tangent to the cover plate 14. The display panel 10 is located in the accommodation space 20, and in some embodiments, the first edge 108 may be adjacent to the top part 21 and the first slot 103 may be concaved from the first edge 108 or the first slot 103 may be located adjacent to the first edge 108 and spaced from the first edge 108, that is, the top part 21 may correspond to the first slot 103.

Figure 51:
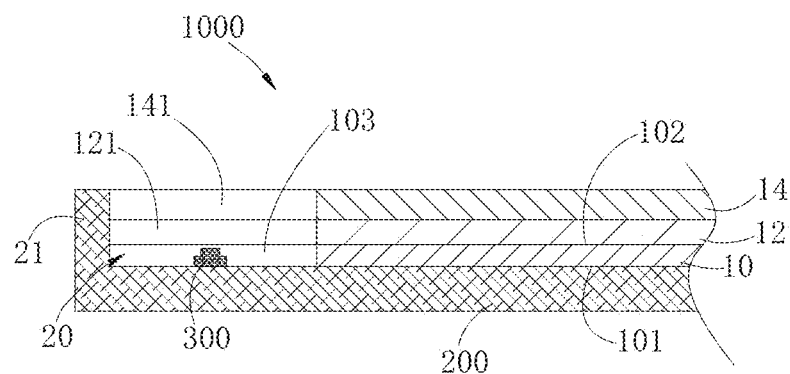
FIG. 51 is a schematic cross-sectional view of an electronic device according to an embodiment of the present disclosure.
Figure 52:
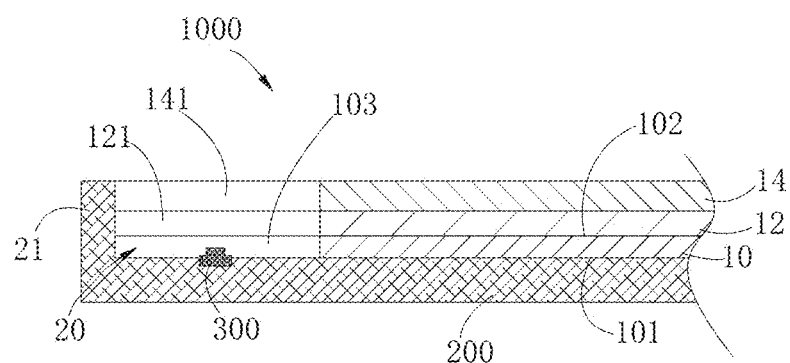
FIG. 52 is a schematic cross-sectional view of an electronic device according to an embodiment of the present disclosure.
Figure 53:
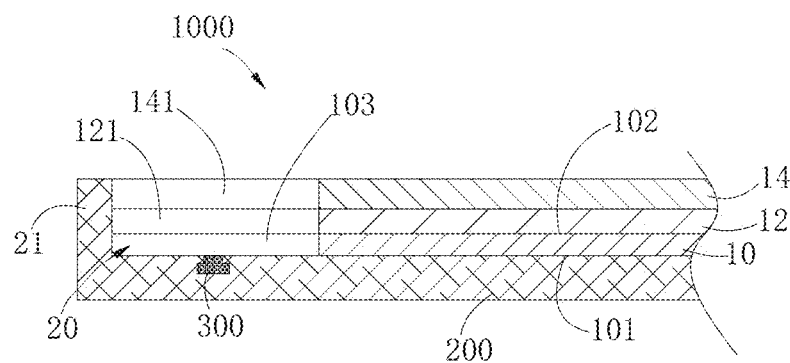
FIG. 53 is a schematic cross-sectional view of an electronic device according to an embodiment of the present disclosure.
Figure 54:
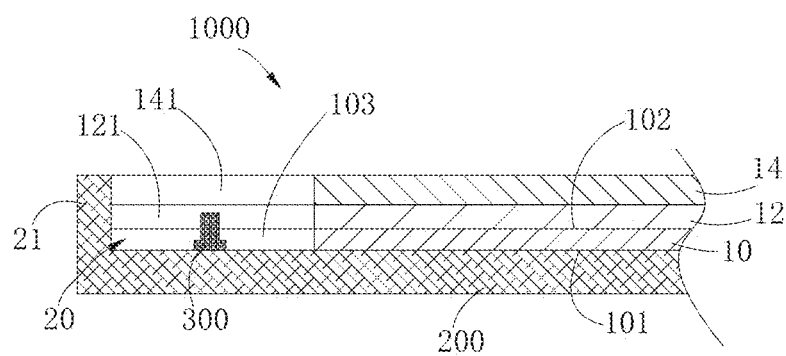
FIG. 54 is a schematic cross-sectional view of an electronic device according to an embodiment of the present disclosure.

FIGS. 51 to 54 illustrate that, the camera 300 is located in the accommodation space 20. The camera 300 is configured to obtain images from objects outside the electronic device 1000. The camera 300 corresponds to the first slot 103, and the camera 300 may be aligned with a middle position of the first slot 103. It is to be understood that, the camera 300 may be aligned with a position deviated from the middle position of the first slot 103. FIG. 51 illustrates that, in some embodiments, the camera 300 is mounted on the body 200, and the camera 300 may be entirely accommodated in the first slot 103. FIG. 52 illustrates that, the camera 300 may also be partially accommodated in the first slot 103, that is, the camera 300 partially extends into the first slot 103. FIG. 53 illustrates that, the camera 300 may also be located outside the first slot 103 and be entirely in the body 200. FIG. 54 illustrates that, in some embodiments, the camera 300 may extend into the first slot 103 and the second slot 121 and is entirely accommodated in the first slot 103 and the second slot 121. The camera 300 may also extend into the first slot 103 and partially extend into the second slot 121. It is to be understood that, in other embodiments, the camera 300 may extend into the first slot 103, the second slot 121, and the third slot 141 and is entirely accommodated in the first slot 103, the second slot 121, and the third slot 141. The camera 300 may also extend into the first slot 103 and the second slot 121 and partially extend into the third slot 141.

Figure 55:
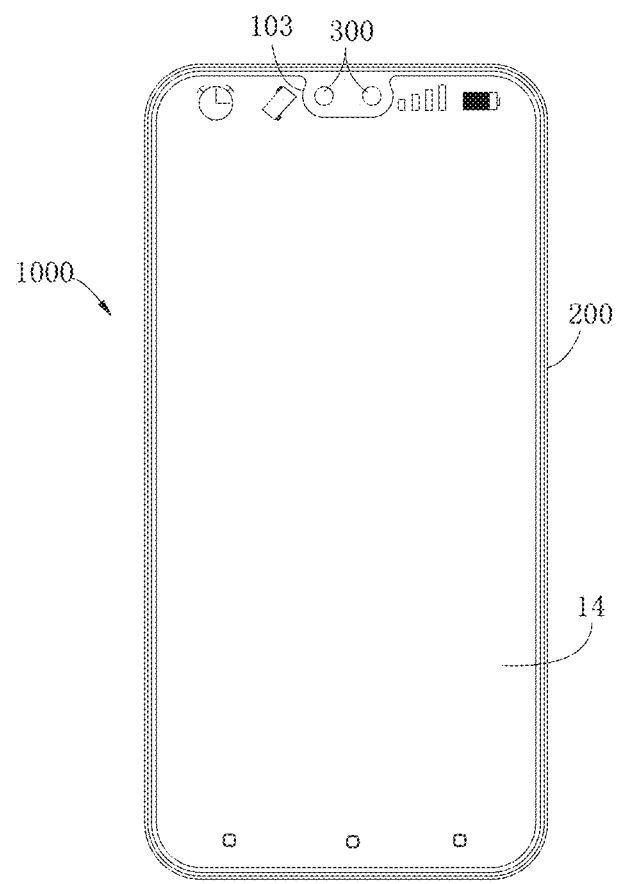
FIG. 55 is a schematic plan view of an electronic device according to an embodiment of the present disclosure.

FIG. 55 illustrates that, in some embodiments, the number of the cameras 300 is two, the two cameras 300 are located in the accommodation space 20, and the two cameras 300 face the first slot 103. In detail, the two cameras 300 face a wall of the display panel 10 surrounding the first slot 103. In some embodiments, the two cameras 300 are entirely located at a middle position of the first slot 103, that is, a midpoint of a line segment formed by connecting centers of the two cameras 300 is located at the middle position of the first slot 103. It is to be understood that, the two cameras 300 may also be entirely located at a position deviated from the middle position of the first slot 103. It is to be understood that, a depth of each of the two cameras 300 extending into the first slot 103, the second slot 121, and the third slot 141 may be a depth of single camera 300 extending into the first slot 103, the second slot 121, and the third slot 141 in any one embodiment. Depths of the two cameras 300 extending into the first slot 103, the second slot 121, and the third slot 141 do not affect each other, that is, for example, both of the two cameras 300 are located in the body 200 and do not extend into the first slot 103, or both of the two cameras 300 extend into the first slot 103, or the second slot 121, or the third slot 141. Alternatively, one of the cameras 300 is located in the body 200 and does not extend into the first slot 103, and the other camera 300 extends into the first slot 103, or the second slot 121, or the third slot 141. Alternatively, one of the cameras 300 extends into the first slot 103 and the other camera 300 extends into the second slot 121 or the third slot 141. It is to be understood that, depths of the two cameras 300 extending into the first slot 103, the second slot 121, and the third slot 141 may be other combination, not listed here.

Figure 56:
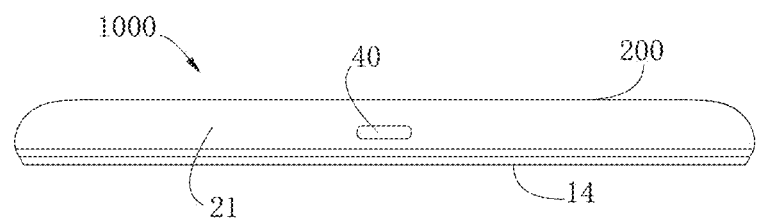
FIG. 56 is a top view of an electronic device according to an embodiment of the present disclosure.
Figure 57:
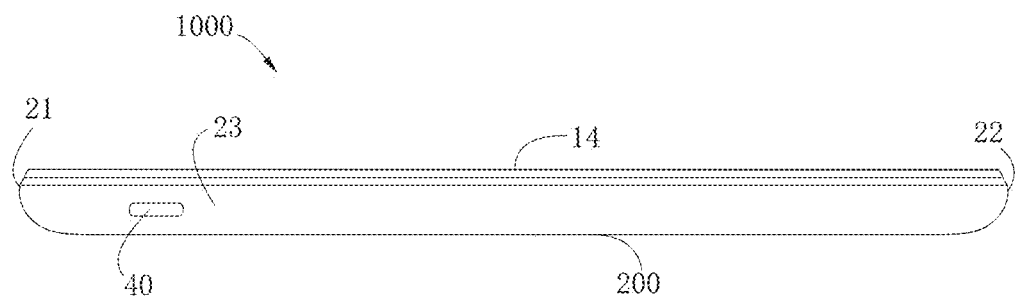
FIG. 57 is a top view of an electronic device according to an embodiment of the present disclosure.

FIG. 1 and FIGS. 56 to 57 illustrate that, the receiver 400 is located in the accommodation space 20, the receiver 400 includes a sound outlet 40; the sound outlet 40 of the receiver 400 is located in the top part 21 or the side part 23. In detail, FIG. 56 illustrates that the sound outlet 40 may be located at a middle position of the top part 21. In other embodiments, the sound outlet 40 may be located at a position deviated from the middle position of the top part 21. FIG. 57 illustrates that, the sound outlet 40 may be located at a position of the side part 23 adjacent to the top part 21. The sound outlet 40 of the embodiment is located in the top part 21 or the side part 23 to save space of the cover plate 14 and the display panel 10 so that an area of the display panel 10 can be arranged to be large and the screen ratio of the electronic apparatus 1000 is improved.

The display assembly 100 of an embodiment includes at least one area penetrating the display assembly 100 (see FIGS. 47 and 49). The sound outlet 40 is exposed via the first slot 103, the second slot 121, and the third slot 141, or the sound outlet 40 is exposed via the first slot 103 and the third slot 141.

Figure 58:
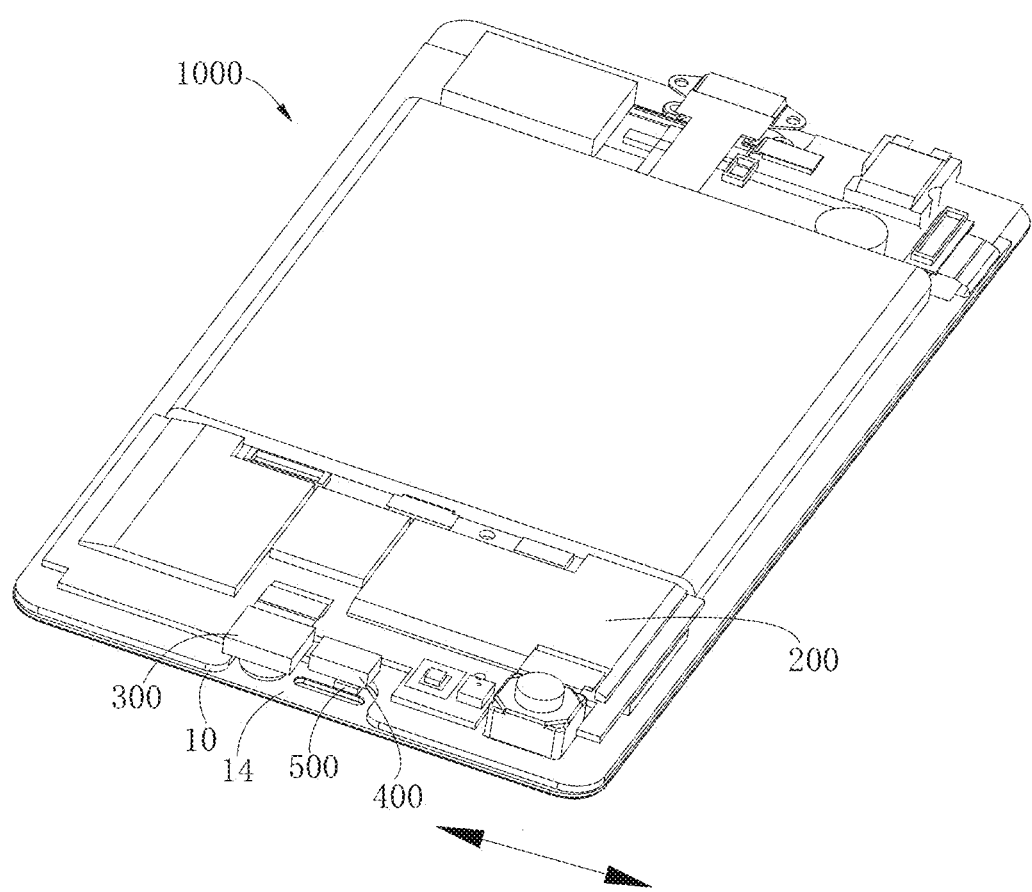
FIG. 58 is a schematic isometric view of an electronic device according to an embodiment of the present disclosure.
Figure 59:
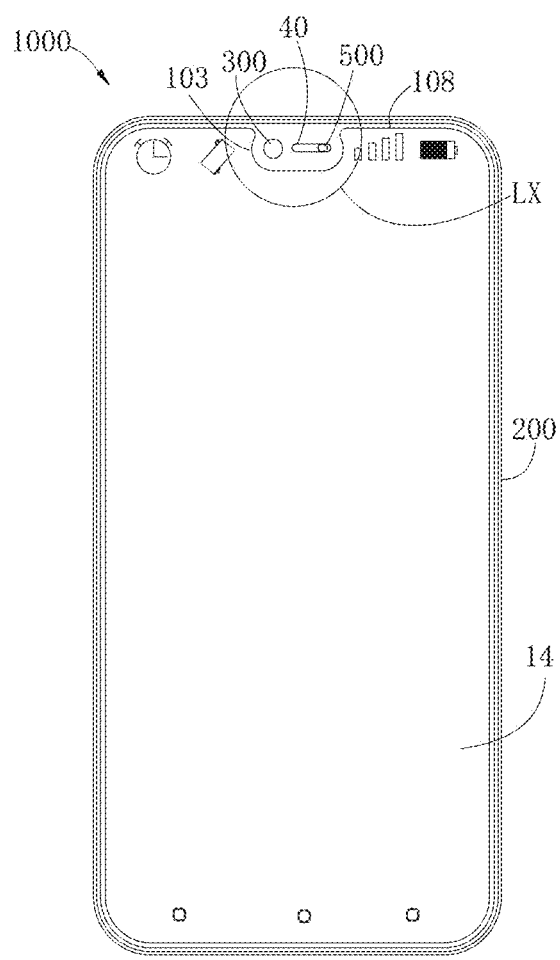
FIG. 59 is a schematic plan view of an electronic device according to an embodiment of the present disclosure.

FIGS. 58 and 59 illustrate that, the electronic device 1000 further includes a light sensor 500 located in the accommodation space, and the light sensor 500 is located on an inner wall of the display panel 10 surrounding the sound output 40, so that the light sensor 500 does not occupy a lateral space of the first slot 103, size of the first slot 103 is reduced and screen ratio of the electronic device 1000 is improved. In detail, outline of the sound outlet 40 may be parallel to the first edge 108, and the light sensor 500 may be located on one end of the inner wall of the display panel 10 surrounding the sound outlet 40, and the light sensor 500 may be fixed to the inner wall of the display panel 10 surrounding the sound outlet 40 by glue or engagement.

Figure 60:
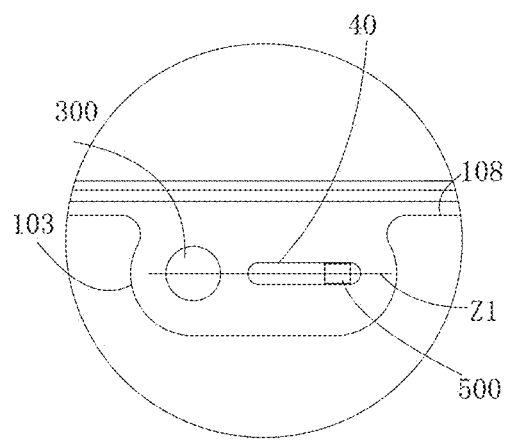
FIG. 60 is an enlarged schematic view of a portion designated LX in FIG. 59.

FIG. 60 illustrates that, in some embodiments, centers of the camera 300, the receiver 400, and the light sensor 500 are located on a same line Z1, and the line L1 may be parallel to the first edge 108. It is to be understood that, in other embodiments, the line where centers of the camera 300, the receiver 400, and the light sensor 500 located may also intersect the first edge 108 at an arbitrary angle, such as perpendicular to the first edge 108.

Figure 61:
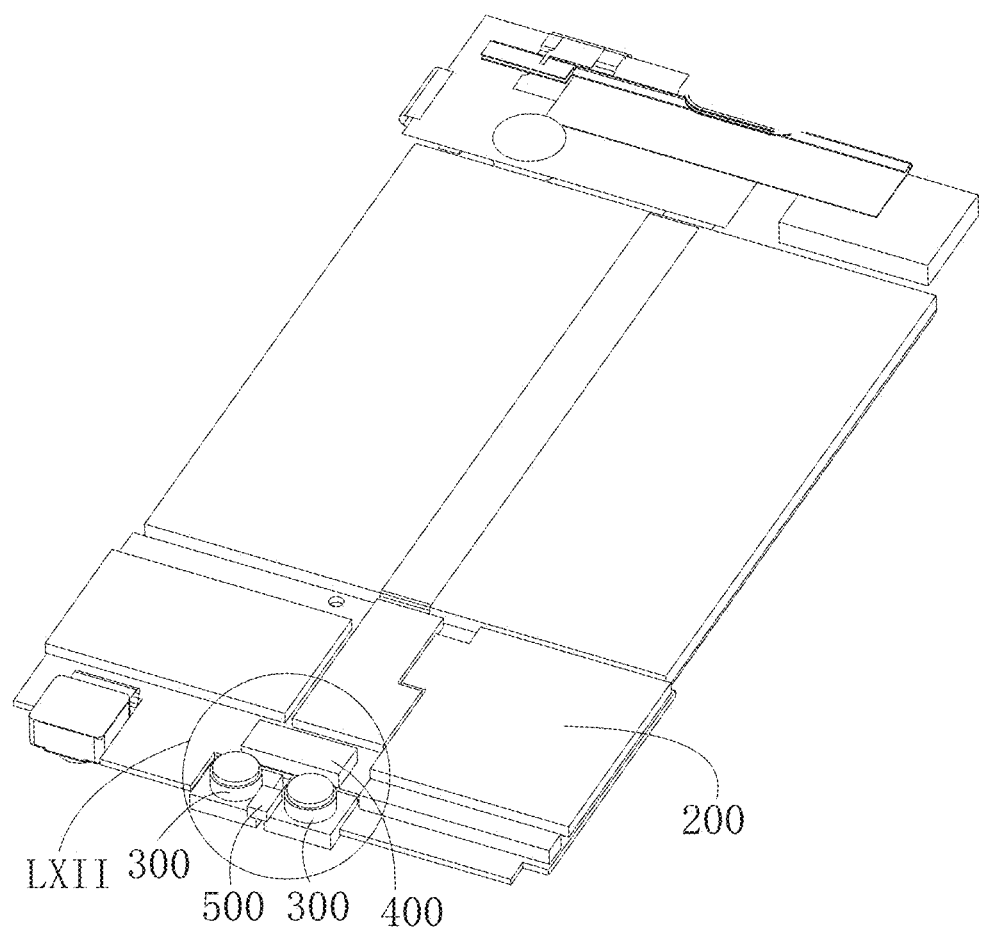
FIG. 61 is a schematic isometric view of an electronic device according to an embodiment of the present disclosure.
Figure 62:
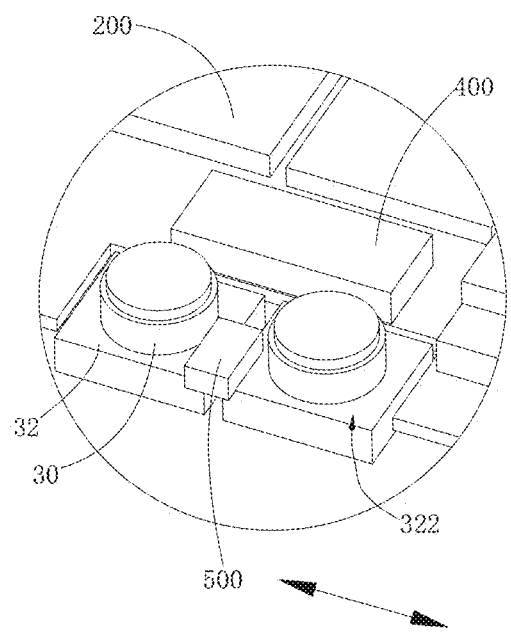
FIG. 62 is an enlarged schematic view of a portion designated LXII in FIG. 61.

FIGS. 61 and 62 illustrate that, the electronic device 1000 of an embodiment includes two cameras 300. The camera 300 includes a lens holder 32 and a lens barrel 30 coupled to the lens holder 32, the light sensor 500 is located on a top surface 322 of the lens holder 32, so that lateral dimension common to the camera 300 and the light sensor 500 is reduced, size of the slot 103 can be reduced, and screen ratio of the electronic device 1000 is improved. In detail, the light sensor 500 may be located on the top surface 322 of the lens holder 32 of one of the cameras 300, or may be located on the top surfaces 322 of the two lens holders 32 of the two cameras 300. The receiver 400 may also be located on a plane of the top surface 322.

Figure 63:
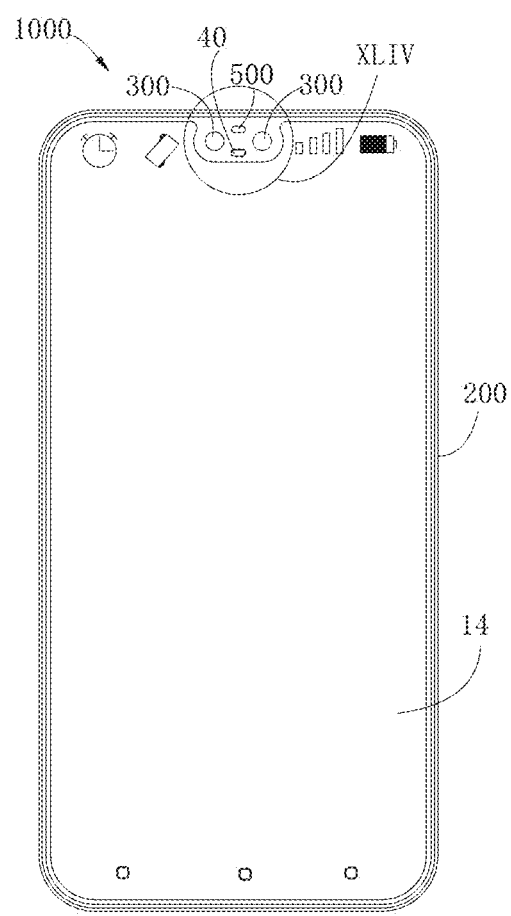
FIG. 63 is a schematic plan view of an electronic device according to an embodiment of the present disclosure.
Figure 64:
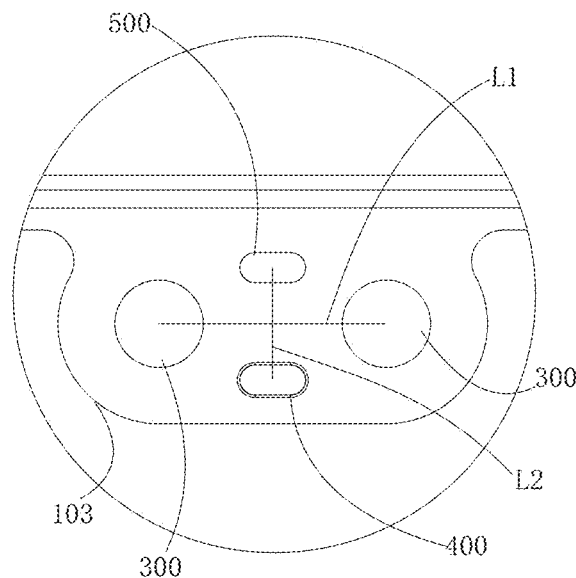
FIG. 64 is an enlarged schematic view of a portion designated XLIV in FIG. 63.
Figure 65:
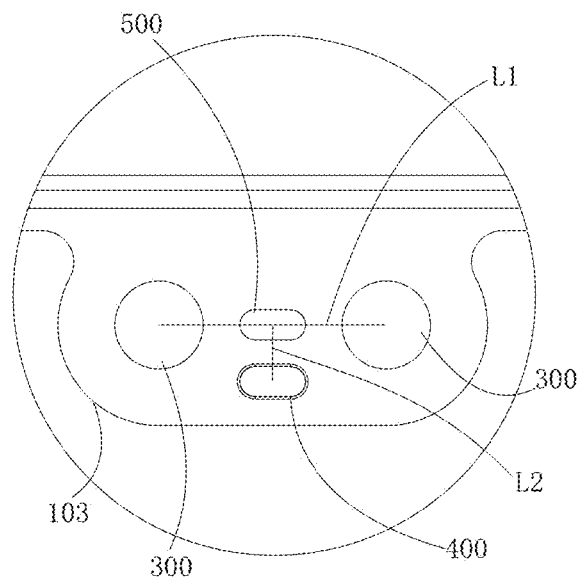
FIG. 65 is a partial plan view of an electronic device according to an embodiment of the present disclosure.

FIGS. 63 and 64 illustrate that, in some embodiments, centers of the two cameras 300 are connected into a first line segment L1, centers of the receiver 400 and the light sensor 500 are connected into a second line segment L2, the first line segment L1 is approximately perpendicular to the second line segment L2. In detail, the first line segment L1 may be substantially parallel to the first edge 108 and the second line segment L2 may be substantially perpendicular to the first edge 108. FIG. 64 illustrates that, the first line segment L1 may pass through a midpoint of the second line segment L2, and the first line segment L1 may also pass through an endpoint of the second line segment L2, for example, the first line segment L1 passes through an endpoint of the second line segment L2 where the center of the light sensor 500 located or the first line segment L1 passes through an endpoint of the second line segment L2 where the center of the receiver 400 located.

Figure 66:
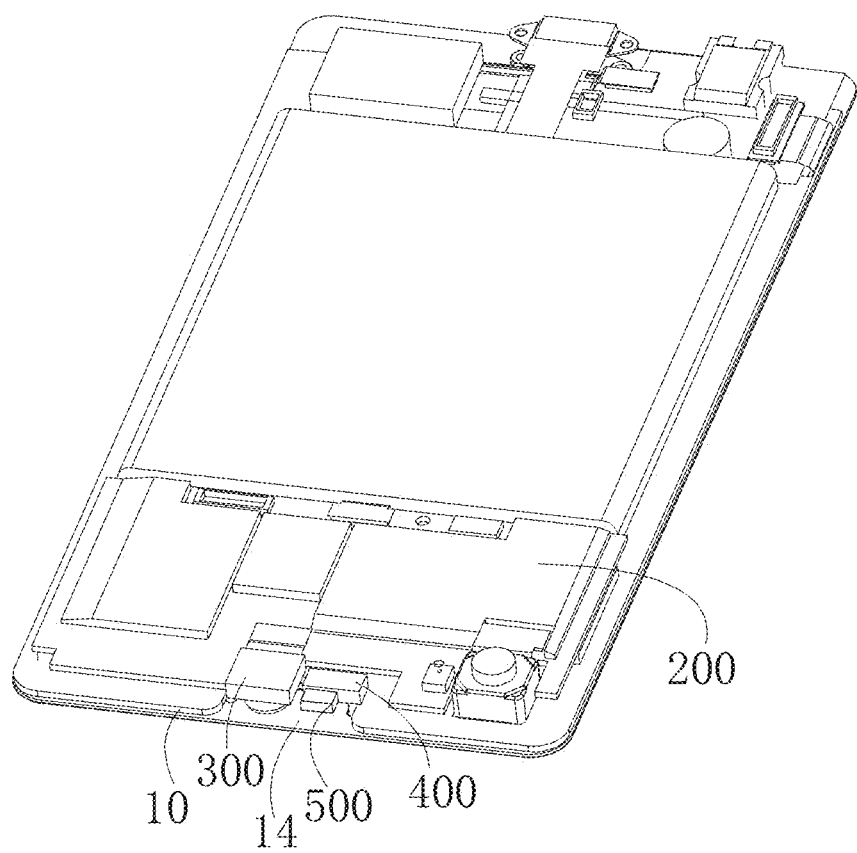
FIG. 66 is a schematic isometric view of an electronic device according to an embodiment of the present disclosure.
Figure 67:
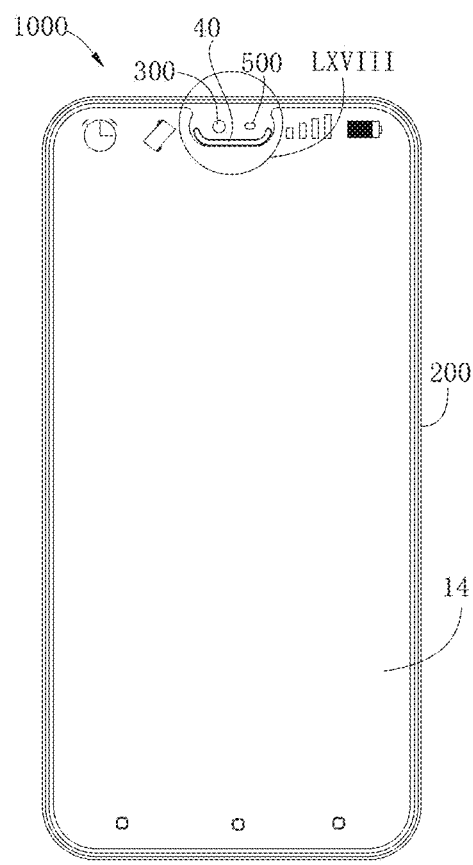
FIG. 67 is a schematic plan view of an electronic device according to an embodiment of the present disclosure.
Figure 68:
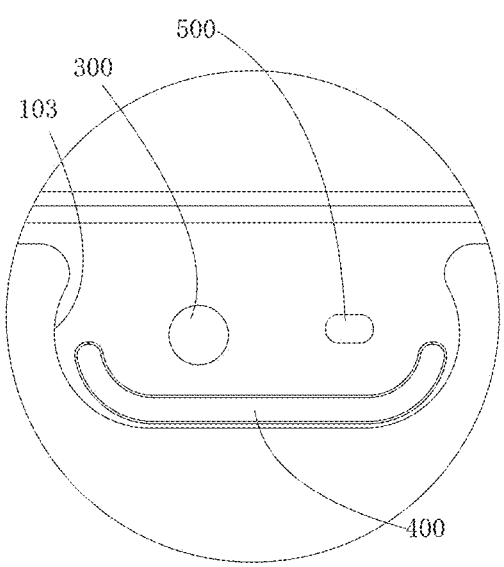
FIG. 68 is an enlarged schematic view of a portion designated LXVIII in FIG. 67.

FIGS. 66 to 68 illustrate that, in an embodiment, a projection profile of the sound outlet 40 is approximately the same as a projection profile of the inner wall of the display panel 10 surrounding the first slot 103 in a direction perpendicular to the cover plate 14. In detail, in a projection perpendicular to the cover plate 14, a projection profile of the sound outlet 40 adjacent to the inner wall of the display panel 10 surrounding the first slot 103 or a portion of the projection profile of the sound outlet 40 substantially coincides with the projection profile of the inner wall of the display panel 10 surrounding the first slot 103. In other words, a portion of the projection profile of the sound outlet 40 is arranged at the edge of the first slot 103. The camera 300 and the light sensor 500 are located above the sound output 40. In another embodiment, the sound outlet 40 is arranged outside the first slot 103, conformably extending along the profile of the inner wall of the display panel 10 surrounding the first slot 103.

Figure 69:
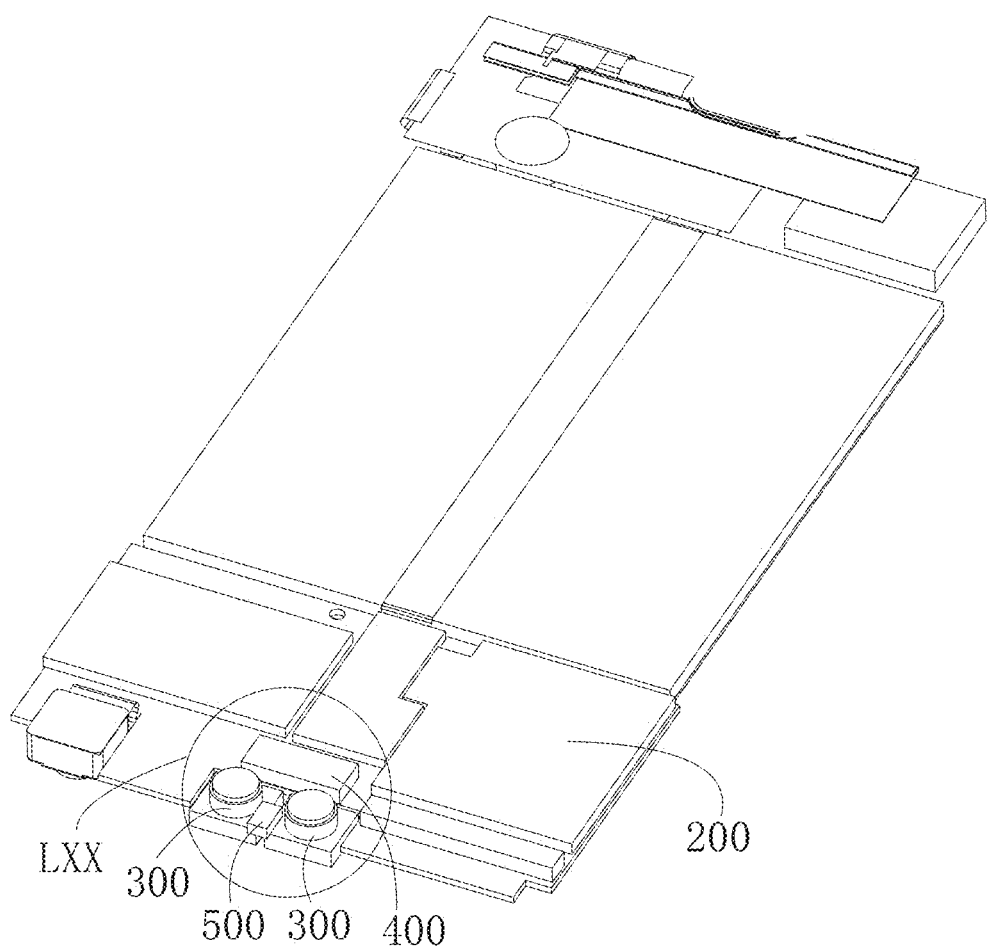
FIG. 69 is a schematic isometric view of an electronic device according to an embodiment of the present disclosure.
Figure 70:
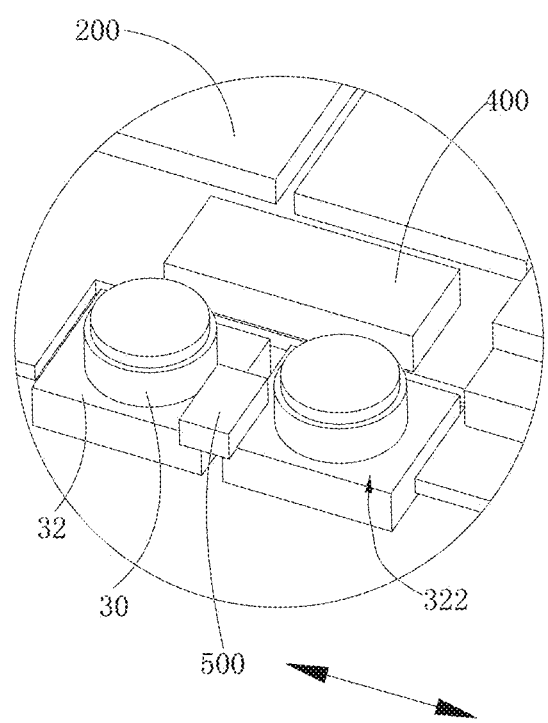
FIG. 70 is an enlarged schematic view of a portion designated LXX in FIG. 69.

FIGS. 69 to 70 illustrate that, the electronic device 1000 of an embodiment includes two cameras 300. The camera 300 includes a lens holder 32 and a lens barrel 30 coupled to the lens holder 32, the light sensor 500 is located on a top surface 322 of the lens holder 32, so that lateral dimension common to the camera 300 and the light sensor 500 is reduced, size of the slot 103 can be reduced, and screen ratio of the electronic device 1000 is improved. In detail, the light sensor 500 may be located on the top surface 322 of the lens holder 32 of one of the cameras 300, or may be located on the top surfaces 322 of the two lens holders 32 of the two cameras 300. The receiver 400 may also be located on a plane of the top surface 322.

Figure 71:
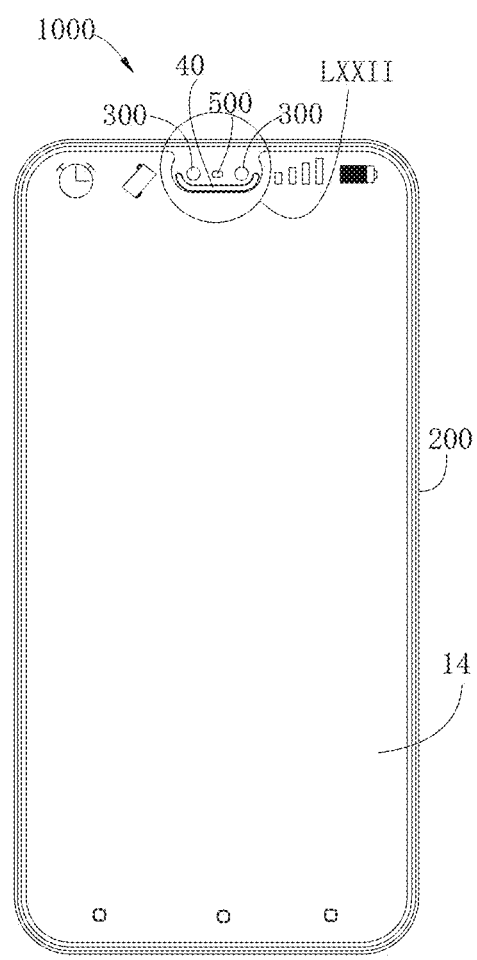
FIG. 71 is a schematic plan view of an electronic device according to an embodiment of the present disclosure.
Figure 72:
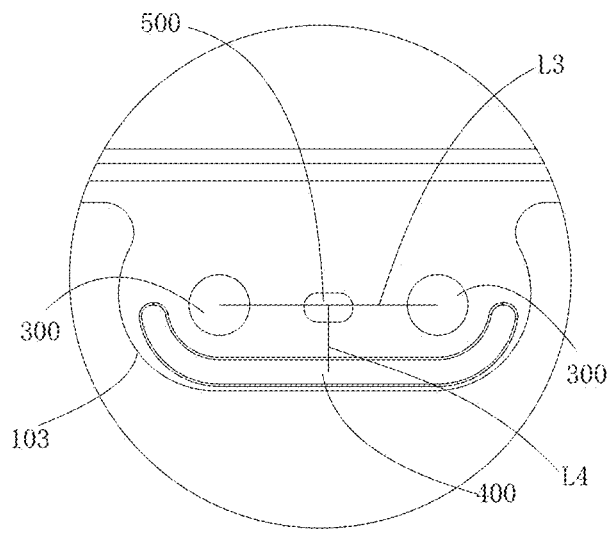
FIG. 72 is an enlarged schematic view of a portion designated LXXII in FIG. 71.

FIGS. 71 and 72 illustrate that, in some embodiments, centers of the two cameras 300 are connected into a third line segment L3, centers of the receiver 400 and the light sensor 500 are connected into a fourth line segment L4, the third line segment L3 is perpendicular to the fourth line segment L4. In detail, t the third line segment L3 may be substantially parallel to the first edge 108 and the fourth line segment L4 may be substantially perpendicular to the first edge 108.

FIG. 72 illustrates that, the third line segment L3 may pass through an endpoint of the fourth line segment L3, for example, the third line segment L3 passes through an endpoint of the fourth line segment L3 where the center of the light sensor 500 located. In other embodiments, the third line segment L3 may pass through a midpoint of the fourth line segment L4 or other locations of the fourth line segment L4.

Figure 73:
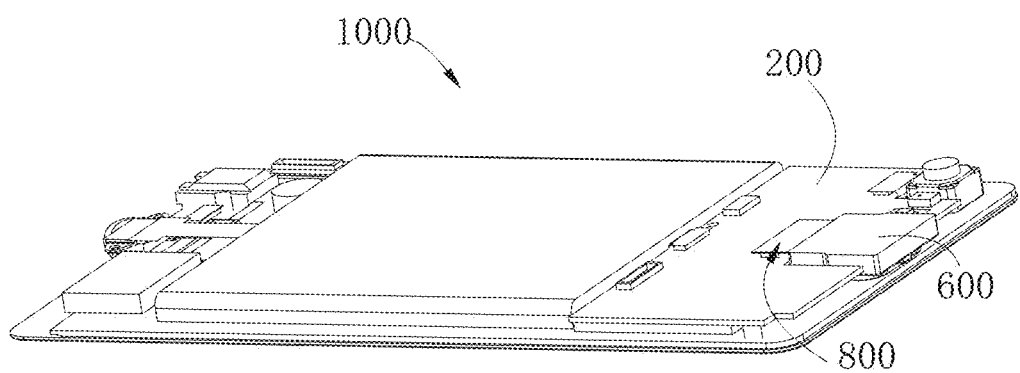
FIG. 73 is a schematic isometric view of an electronic device according to an embodiment of the present disclosure.
Figure 74:
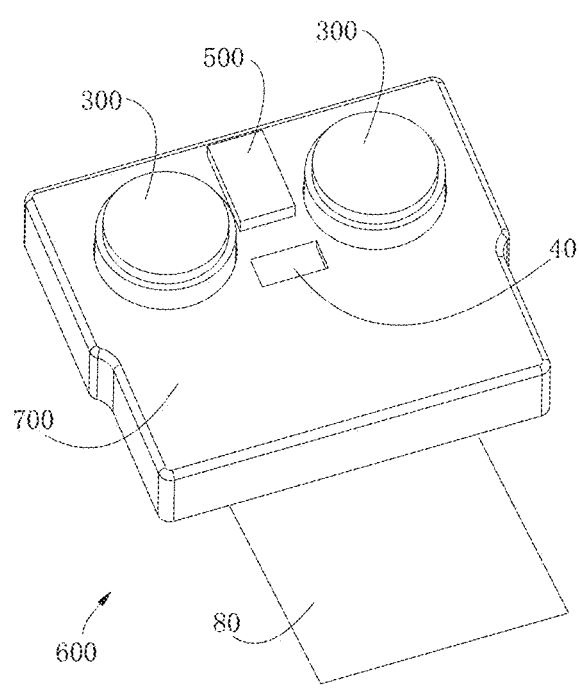
FIG. 74 is a schematic isometric view of an input/output module according to an embodiment of the present disclosure.

FIGS. 73 and 74 illustrate that, the electronic device 1000 of an embodiment includes an input/output module 600. The camera 300, the light sensor 500, and the receiver 400 are integrated in the input/output module 600, and the input/output module 600 further includes a base 700 and a circuit board 800.

The base 700 may be configured to receive the camera 300, the light sensor 500, and the receiver 400, in detail, the base 700 includes a light transmissive region corresponding to the camera 300 and the light sensor 500 so that light enters the base 700 from the light transmissive region and is received by the camera 300 and the light sensor 500. The base 700 includes a sound region corresponding to the receiver 400 so that sound of the receiver 400 can be transmitted from the sound region.

The camera 300, the light sensor 500, and the receiver 400 are located on the circuit board 800. In detail, the circuit board 800 includes a hard board (not shown) and a flexible board 80 accommodated in the base 700, the camera 300, the light sensor 500, and the receiver 400 are located on the hard board, and the flexible board 80 extends to the outside of the base 700.

When the input/output module 600 is mounted on the electronic device 1000, the circuit board 800 can be connected to a main board of the electronic device 1000 to realize information exchange between the input/output module 600 and the mainboard of the electronic device 1000. The mounting position of the input/output module 600 may correspond to the first slot 103.

In detail, the input/output module 600 may include one camera 300 or two cameras 300, and the detail arrangement between the camera 300, the light sensor 500, and the receiver 400 may be approximately the same as any one of those disclosed in the above embodiments, and is not described here.

Figure 75:
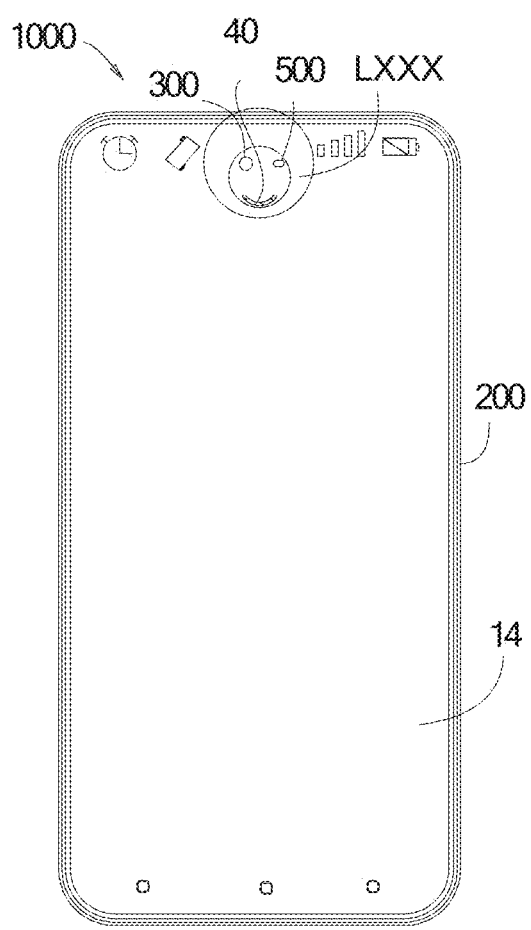
FIG. 75 is a schematic plan view of an electronic device according to an embodiment of the present disclosure.
Figure 76:
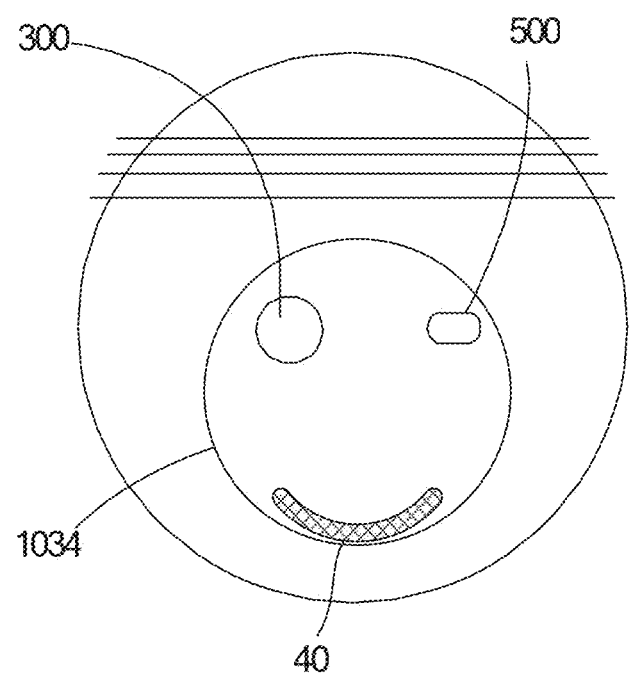
FIG. 76 is an enlarged schematic view of a portion designated LXXX in FIG. 75.
Figure 77:
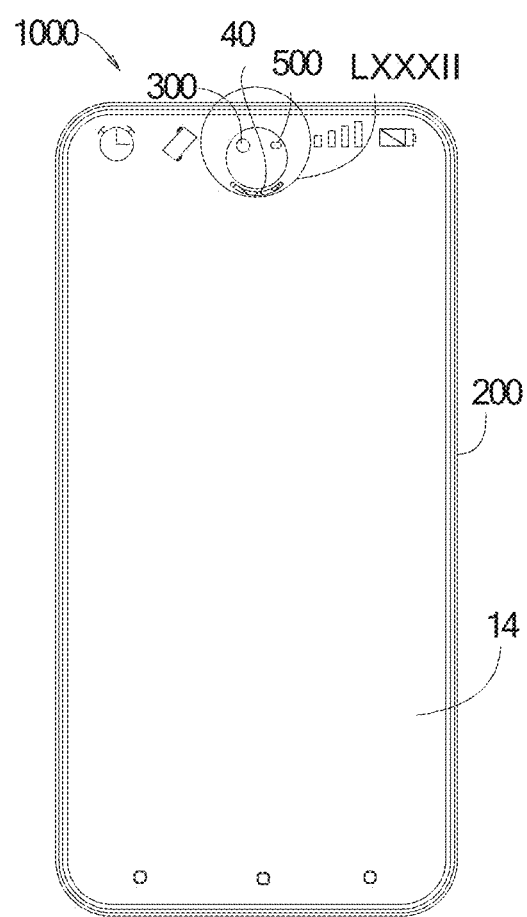
FIG. 77 is a schematic plan view of an electronic device according to an embodiment of the present disclosure.
Figure 78:
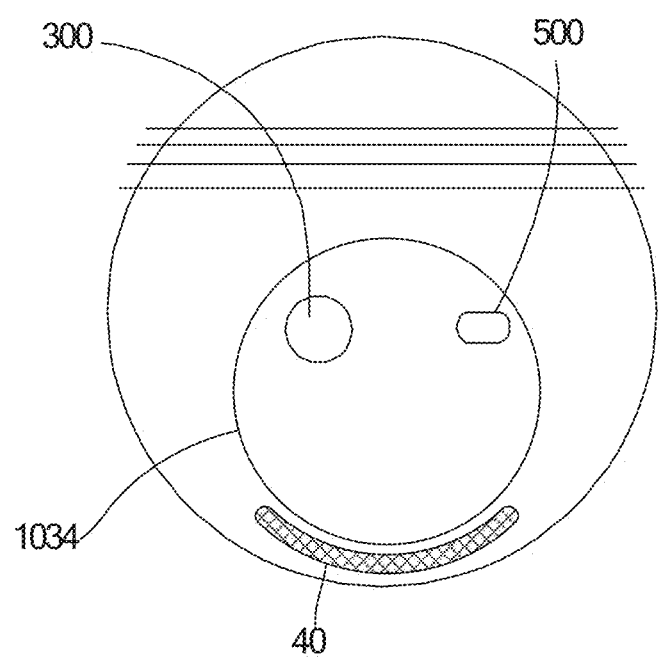
FIG. 78 is an enlarged schematic view of a portion designated LXXXII in FIG. 77.

FIGS. 75 to 78 illustrate that, in an embodiment, a projection profile of the sound outlet 40 is approximately the same as a projection profile of the inner wall of the display panel 10 surrounding the at least one hole 1034 in a direction perpendicular to the cover plate 14. In detail, in a projection perpendicular to the cover plate 14, a projection profile of the sound outlet 40 adjacent to the inner wall of the display panel 10 surrounding the at least one hole 1034 or a portion of the projection profile of the sound outlet 40 substantially coincides with the projection profile of the inner wall of the display panel 10 surrounding the at least one hole 1034. In other words, a portion of the projection profile of the sound outlet 40 is arranged at the edge of the at least one hole 1034. The camera 300 and the light sensor 500 are located above the sound output 40. FIGS. 75 to 76 illustrate that, in an embodiment, the sound outlet 40 is arranged within the at least a hole 1034. FIGS. 77 to 78 illustrate that, in another embodiment, the sound outlet 40 is arranged outside the at least a hole 1034. In some embodiments, the sound outlet 40 is an annular structure. A number of the at least one camera is two.

In an embodiment, the display panel 10 includes at least a void extending through the display surface 101 and the back surface 102. The at least a void is located in the display area 11 and is configured for exposure of at least one component of the electronic device 1000. The display area 11, except the at least a void, includes a plurality of image pixels. The void can be a slot. The at least a void can be at least a notch recessed from an edge of the display panel 10. Or, the at least a void can be at least a hole defined in the display panel 10.

In an embodiment, the at least one component of the electronic device 1000 is selected from the group including the at least one camera, a receiver, a light sensor, a projector, a microphone, a speaker, a distance sensor, an illuminator, and a combination thereof. A number of the at least one camera is two. In another embodiment, the at least one camera includes two front cameras. One of the two front cameras is an infrared camera. The infrared camera includes an image sensor and an infrared filter. The light sensor is an ambient light sensor. The projector is a dot projector including a laser such as a vertical cavity surface emitting laser (VCSEL). The distance sensor is a proximity sensor. The illuminator is a flood illuminator including a laser such as a VCSEL.

In detail, the proximity sensor and the ambient light sensor help the at least one camera determine how much illumination is needed for recognition of a face. The flood illuminator produces infrared (IR) light, part of electromagnetic spectrum invisible to an eye of the face, to illuminate the face. The dot projector produces more than 30,000 dots of invisible IR light to create a three-dimensional map (for area and depth) of a facial landscape of the face. The infrared camera captures images of dot patterns and IR light reflected from the face. Therefore, the infrared camera uses IR light to establish presence of the face.

In the description of this specification, the description of the terms "one embodiment," "some embodiments," "exemplary embodiment," "examples," "specific examples," or "some examples," etc., means to refer to the specific feature, structure, material or characteristic described in connection with the embodiments or examples being included in at least one embodiment or example of the present disclosure. In the present specification, the term of the above schematic representation is not necessary for the same embodiment or example. Furthermore, the specific feature, structure, material, or characteristic described may be in combination in a suitable manner in any one or more of the embodiments or examples.

In addition, terms such as "first" and "second" are used herein for purposes of description and are not intended to indicate or imply relative importance or significance or to imply the number of indicated technical features. Thus, the feature defined with "first" and "second" may include one or more of this feature. In the description of the present disclosure, "a plurality of" means two or more than two, unless specified otherwise.

The foregoing descriptions are merely exemplary embodiments of the present disclosure, rather than limiting the present disclosure. Various modifications and alterations may be made to the present disclosure for a person skilled in the art. Any modification, equivalent substitution, improvement or the like made within the spirit and principle of the present disclosure shall fall into the protection scope of the present disclosure.

What is claimed is:

1. An electronic device, comprising:
    a display panel comprising a full screen display area, the full screen display area comprising a display surface and a back surface opposite to the display surface, the display panel defining a slot extending through the display surface and the back surface, the slot being located in the full screen display area, the full screen display area comprising a plurality of image pixels configured to display data information;
    two cameras received in the slot; and
    at least one light sensor received in the slot.

2. The electronic device as claimed in claim 1, further comprising a receiver, wherein centers of the two cameras are connected into a first line segment, centers of the receiver and the at least one light sensor are connected into a second line segment, and the first line segment is perpendicular to the second line segment.

3. The electronic device as claimed in claim 2, wherein the second line segment passes through a midpoint of the first line segment.

4. The electronic device as claimed in claim 3, wherein the first line segment passes through a midpoint of the second line segment.

5. The electronic device as claimed in claim 3, the first line segment passes through an endpoint of the second line segment where the center of the at least one light sensor is located or the first line segment passes through an endpoint of the second line segment where the center of the receiver is located.

6. The electronic device as claimed in claim 1, further comprising a receiver, wherein centers of the two cameras, the receiver, and the at least one light sensor are located on a same line.

7. The electronic device as claimed in claim 6, wherein the receiver comprises a sound outlet, and the at least one light sensor is located on an inner wall of the display panel surrounding the sound outlet.

8. The electronic device as claimed in claim 7, wherein the sound outlet is located around the slot or arranged inside the slot.

9. The electronic device as claimed in claim 8, wherein a projection profile of the sound outlet is the same as a projection profile of an inner wall of the display panel surrounding the slot.

10. The electronic device as claimed in claim 1, wherein a midpoint of a line segment formed by connecting centers of the two cameras is located at a middle position of the slot.

11. The electronic device as claimed in claim 1, wherein the display panel comprises a first edge and a main body, the slot comprises a notch concaved from the first edge toward the main body of the display panel.

12. The electronic device as claimed in claim 11, wherein the notch is concaved from a middle position of the first edge.

13. The electronic device as claimed in claim 1, wherein the display panel comprises a first edge, and the slot comprises a hole located adjacent to a middle position of the first edge.

14. The electronic device as claimed in claim 1, further comprising a touch panel attached to the display panel, wherein the touch panel defines a second slot corresponding to the slot.

15. The electronic device as claimed in claim 14, further comprising a cover plate attached to the touch panel, wherein the cover plate defines a third slot corresponding to the slot.

16. The electronic device as claimed in claim 15, wherein the two cameras are at least partially received in at least one of the slot, the second slot, and the third slot, or the two cameras are located outside at least one of the slot, the second slot, and the third slot.

17. An electronic device, comprising a display assembly, the display assembly comprising:
    a display panel comprising a display area, the display area comprising a display surface and a back surface opposite to the display surface, the display panel comprising at least a void extending through the display surface and the back surface, the at least a void located in the display area, a plurality of image pixels disposed across an entirety of the display area except the at least a void;
    a touch panel coupled to the display panel;
    two cameras received in the at least a void; and
    at least one light sensor received in the at least a void.

18. The electronic device as claimed in claim 17, further comprising a receiver received in the at least a void, wherein centers of the two cameras are connected into a first line segment, centers of the receiver and the at least one light sensor are connected into a second line segment, and the first line segment is perpendicular to the second line segment.

19. The electronic device as claimed in claim 17, wherein the two cameras each include a lens holder and a lens barrel coupled to the lens holder, and the at least one light sensor is located on a top surface of the lens holder.

20. An electronic device, comprising:
- a display panel comprising a display area, a plurality of image pixels disposed across an entirety of the display area, the display area defining a slot extending therethrough in a thickness direction of the display panel;
- two cameras received in the slot and configured to obtain images from objects outside the electronic device;
- at least one light sensor received in the slot; and
- a receiver received in the slot;
- wherein centers of the two cameras are connected into a line segment, the at least one light sensor and the receiver are oppositely arranged with respect to the line segment.

* * * * *